United States Patent
Tsujiuchi et al.

(10) Patent No.: US 9,153,673 B2
(45) Date of Patent: Oct. 6, 2015

(54) SEMICONDUCTOR DEVICE

(75) Inventors: Mikio Tsujiuchi, Kawasaki (JP); Tetsuya Nitta, Kawasaki (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 14/378,720

(22) PCT Filed: Feb. 16, 2012

(86) PCT No.: PCT/JP2012/053602
§ 371 (c)(1),
(2), (4) Date: Aug. 14, 2014

(87) PCT Pub. No.: WO2013/121548
PCT Pub. Date: Aug. 22, 2013

(65) Prior Publication Data
US 2015/0014744 A1    Jan. 15, 2015

(51) Int. Cl.
*H01L 29/739* (2006.01)
*H01L 29/417* (2006.01)
*H01L 29/06* (2006.01)
*H01L 27/02* (2006.01)

(52) U.S. Cl.
CPC ........ *H01L 29/7393* (2013.01); *H01L 29/0696* (2013.01); *H01L 29/41708* (2013.01); *H01L 27/0255* (2013.01)

(58) Field of Classification Search
None
See application file for complete search history.

(56) References Cited

U.S. PATENT DOCUMENTS

| 6,914,298 B1 | 7/2005 | Hamazawa |
| 2007/0108518 A1 | 5/2007 | Endo et al. |
| 2009/0206366 A1 | 8/2009 | Sawada et al. |

FOREIGN PATENT DOCUMENTS

| JP | 08-222726 A1 | 8/1996 |
| JP | 08-274308 A | 10/1996 |
| JP | 2001-203358 A | 7/2001 |
| JP | 2003-218348 A | 7/2003 |
| JP | 2007-142041 A | 6/2007 |
| JP | 2007-250780 A | 9/2007 |
| JP | 2008-053610 A | 3/2008 |
| JP | 2009-194197 A | 8/2009 |
| JP | 2010-225848 A | 10/2010 |
| JP | 2010-238839 A | 10/2010 |

OTHER PUBLICATIONS

Office Action issued May 12, 2015, in Japanese Patent Application No. 2013-558634.

*Primary Examiner* — Erik Kielin
(74) *Attorney, Agent, or Firm* — Miles & Stockbridge P.C.

(57) ABSTRACT

In a current-prioritized IGBT, a collector conductive layer is connected to one collector active region included in a collector region by a plurality of contacts. The number of contacts through which the collector conductive layer is connected to the one collector active region is larger than the number of contacts through which the emitter conductive layer is connected to one base active region included in a base region.

27 Claims, 51 Drawing Sheets

FIG.2
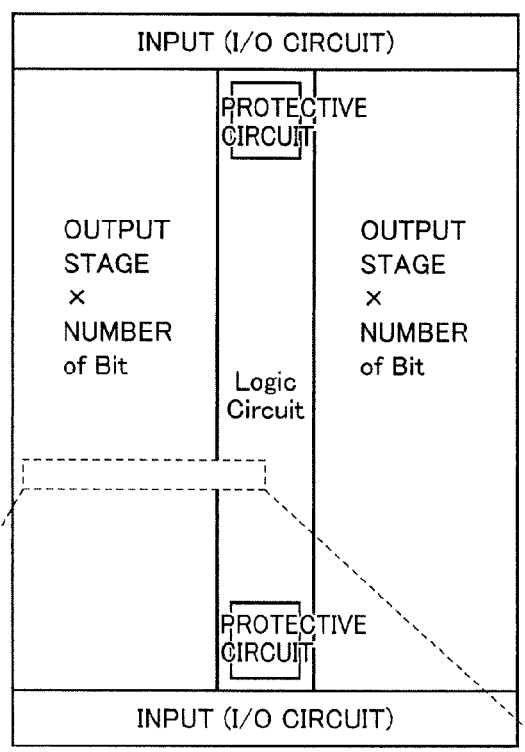
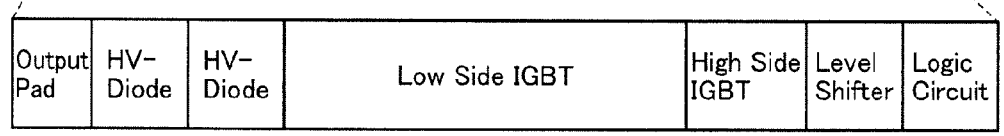

LARGE CONTACT AREA ON p⁺ REGION

SMALL CONTACT AREA ON p⁺ REGION

LARGE COLLECTOR CONTACT AREA

SMALL COLLECTOR CONTACT AREA

SEMICONDUCTOR DEVICE

TECHNICAL FIELD

The present invention relates to a semiconductor device, for example, a semiconductor device having an insulated gate bipolar transistor.

BACKGROUND ART

A lateral (horizontal type) IGBT (Insulated Gate Bipolar Transistor) has been conventionally known and disclosed in, for example, Japanese Patent Laying-Open No. 2001-203358 (PTD 1) and Japanese Patent Laying-Open No. 8-274308 (PTD 2).

CITATION LIST

Patent Document

PTD 1: Japanese Patent Laying-Open No. 2001-203358
PTD 2: Japanese Patent Laying-Open No. 8-274308

SUMMARY OF INVENTION

Technical Problem

To change characteristics such as current and on-state breakdown voltage of a lateral IGBT, it is necessary to perform large-scaled changes, such as a change in an element size, a change in an implantation layout, and a change in an impurity implantation condition, and optimization. Therefore, developing all the elements meeting the respective requirements causes a great burden on development disadvantageously.

Other problems and new features will be apparent from the description in the specification and the attached drawings.

Solution to Problem

According to a semiconductor device of one embodiment, a collector conductive layer is connected to one collector active region included in a collector region by a plurality of contacts. The number of contacts through which the collector conductive layer is connected to one collector active region is larger than the number of contacts through which an emitter conductive layer is connected to one base active region included in a base region.

Advantageous Effects of Invention

According to the one embodiment described above, since a characteristic of the insulated gate bipolar transistor can be readily improved by changing areas of respective conductive layers and connection portions in an emitter and a collector of the insulated gate bipolar transistor, a semiconductor device which is small in a burden on development can be obtained without need for large-scaled changes.

Further, since connection to one collector active region is achieved by a plurality of contacts, current routes can be distributed, and implantation of a minority carrier can be distributed.

BRIEF DESCRIPTION OF DRAWINGS

FIG. 2 represents an image (A) showing a plane layout of an entire chip in the case where the semiconductor device of the first embodiment is applied to a PDP scan driver, and an image (B) showing a plane layout of the image (A) for 1 bit.

DESCRIPTION OF EMBODIMENTS

In the following, embodiments will be described with reference to the drawings.

First Embodiment

Firstly, a configuration of a semiconductor device in accordance with a first embodiment will be described with reference to FIGS. 1 to 6.

Figure 1:
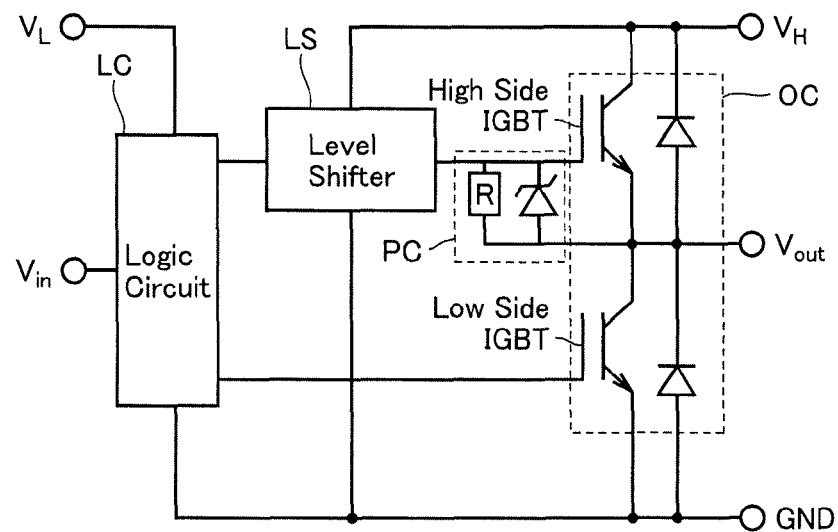
FIG. 1 represents a circuit in a case where a semiconductor device in accordance with a first embodiment is applied to a PDP (Plasma Display Panel) scan driver.

Referring to FIG. 1, a circuit of a PDP scan driver includes an output circuit OC, a level shifter LS, a logic circuit LC, and a protection circuit PC. Output circuit OC includes a totem pole circuit using two IGBTs as main switching elements on Low Side and High Side. This totem pole circuit is configured to be connected between a terminal to which a first drive voltage ($V_H$) is supplied and a terminal to which a second drive voltage (GND) is supplied and to supply a direct-current output $V_{out}$ from an output terminal to a load. In each of the IGBTs on Low Side and High Side, a diode is reversely connected between an emitter and a collector. The IGBT on High Side may be other high breakdown voltage element.

Logic circuit LC is connected to a gate electrode of the IGBT on Low Side of output circuit OC. Further, logic circuit LC is connected to a gate electrode of the IGBT on High Side through level shifter LS and protection circuit PC.

Referring to FIG. 2(A), in a semiconductor chip of the PDP scan driver, output stages corresponding to the number of bits are arranged on both left and right sides in the drawing so as to sandwich the protection circuit and the logic circuit. Further, I/O (Input/Output) circuits are arranged on both upper and lower sides in the drawing so as to sandwich the output stages and the logic circuit.

Referring to FIG. 2(B), the output stages have the arrangement of the level shifter, the IGBT on High Side, the IGBT on Low Side, diodes, and an output pad for each 1 bit.

Figure 3:
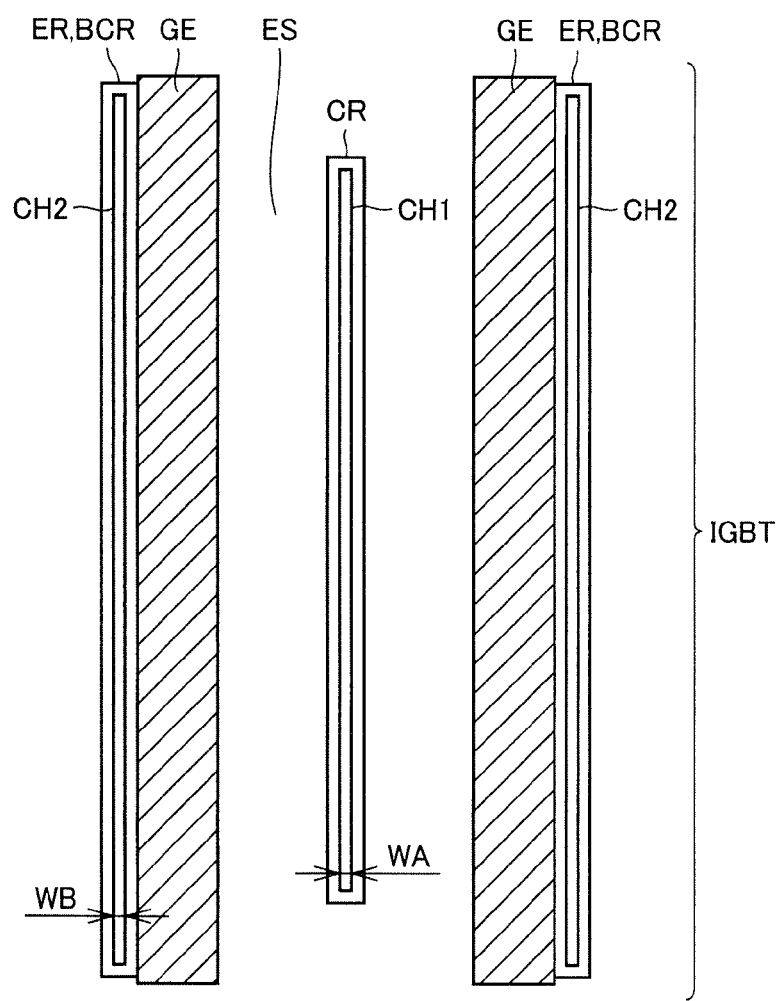
FIG. 3 is a plan view schematically representing a configuration of the IGBT shown in FIGS. 1 and 2.

Referring to FIG. 3, the IGBT on High Side is, for example, a breakdown voltage-prioritized element, and the IGBT on Low Side is, for example, a current-prioritized element. Here, the breakdown voltage-prioritized IGBT is an IGBT which is configured to have a high breakdown voltage by setting a lower impurity concentration in a drift region or by setting a larger length between a collector and an emitter in the drift region than the current-prioritized IGBT. Further, the current-prioritized IGBT is an IGBT which is configured to have a high current-driving capability by setting a larger channel width, setting a smaller channel length, or setting a smaller channel resistance than the breakdown voltage-prioritized IGBT. Further, the term "breakdown-voltage-prioritized" means that, assuming the case where contact layouts of the emitter and the collector are the same, the contact layout of the collector is changed from that layout so that a breakdown voltage higher than original is obtained. Further, the term "current-prioritized" means that, assuming that the contact layouts of the emitter and the collector are the same, the contact layout of the collector is changed from that layout so that current more than original flows. Even being slight in degree, a similar effect can be obtained when metal silicide is used.

Figure 5:
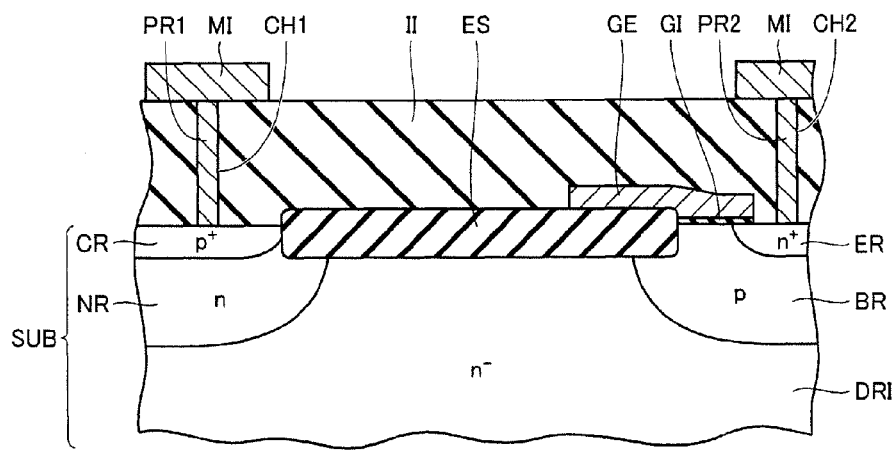
FIG. 5 is a schematic cross-sectional view taken along the line V-V of FIG. 4.
Figure 6:
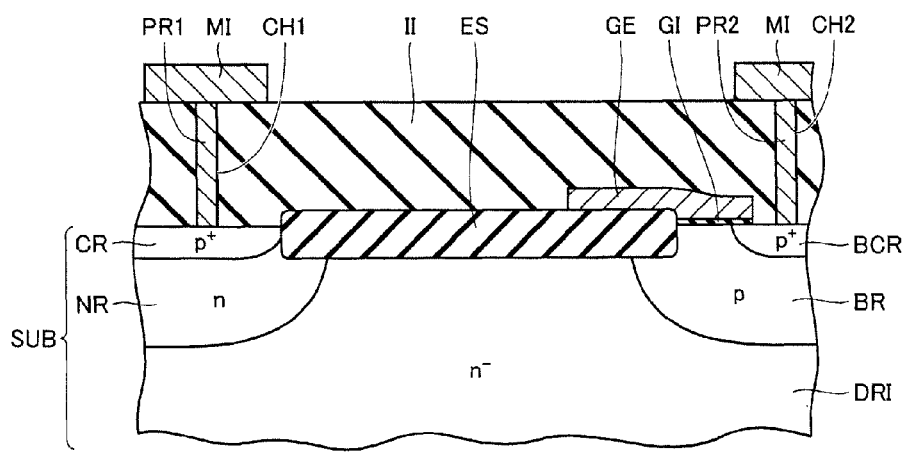
FIG. 6 is a schematic cross-sectional view taken along the line VI-VI of FIG. 4.

Referring to FIGS. 5 and 6, the IGBT is formed on a main surface of a semiconductor substrate SUB. This IGBT mainly includes an $n^-$ drift region DRI, an n-type region NR, a $p^+$ collector region CR, p-type base regions BR, BCR, an $n^+$ emitter region ER, a gate insulating film GI, and a gate electrode layer GE.

$N^-$ drift region DRI is formed in semiconductor substrate SUB. N-type region NR is formed in semiconductor substrate SUB so as to be in contact with $n^-$ drift region DRI. $P^+$ collector region CR is formed in semiconductor substrate SUB and on the main surface of semiconductor substrate SUB so as to constitute pn junction with n-type region NR.

P-type base regions BR, BCR are separated apart from $p^+$ collector region CR and formed in semiconductor substrate SUB and on the main surface of semiconductor substrate SUB so as to constitute pn junction with $n^-$ drift region DRI. P-type base regions BR, BCR include p-type region BR constituting pn junction with $n^-$ drift region DRI, and $p^+$ base contact region BCR located on the main surface of semiconductor substrate SUB in p-type region BR. $P^+$ base contact region BCR has a higher p-type impurity concentration than that of p-type region BR. $N^+$ emitter region ER is formed on the main surface of semiconductor substrate SUB in p-type base regions BR, BCR to constitute pn junction with p-type base regions BR, BCR.

On the main surface of semiconductor substrate SUB sandwiched between p⁺ collector region CR and p-type base regions BR, BCR, an element separation structure ES is formed. This element separation structure ES may be, for example, a silicon oxide film formed of LOCOS (Local Oxidation of Silicon) or may be STI (Shallow Trench Isolation).

Gate electrode layer GE is formed on p-type region BR, which is sandwiched between at least n⁺ emitter region ER and n⁻ drift region DRI, through gate insulating film GI. One end of gate electrode layer GE lies on element separation structure ES to oppose n⁻ drift region DRI while element separation structure ES is sandwiched therebetween.

On the main surface of semiconductor substrate SUB having the IGBT formed thereon, an interlayer insulating film II is formed so as to cover the IGBT. This interlayer insulating film II has contact recesses CH1, CH2 formed therein. Contact recess CH1 is formed so as to reach p⁺ collector region CR from an upper face of interlayer insulating film II. Contact recess CH2 is formed so as to reach both n⁺ emitter region ER and p⁺ base contact region BCR from the upper face of interlayer insulating film II.

A plug layer (collector conductive layer) PR1 made of conductive material is formed so as to fill contact recess CH1. Further, a plug layer (emitter conductive layer) PR2 made of conductive material is formed so as to fill contact recess CH2. Metal interconnections MI are formed on interlayer insulating film II so as to come in contact with these plug layers PR1, PR2, respectively.

Figure 4:
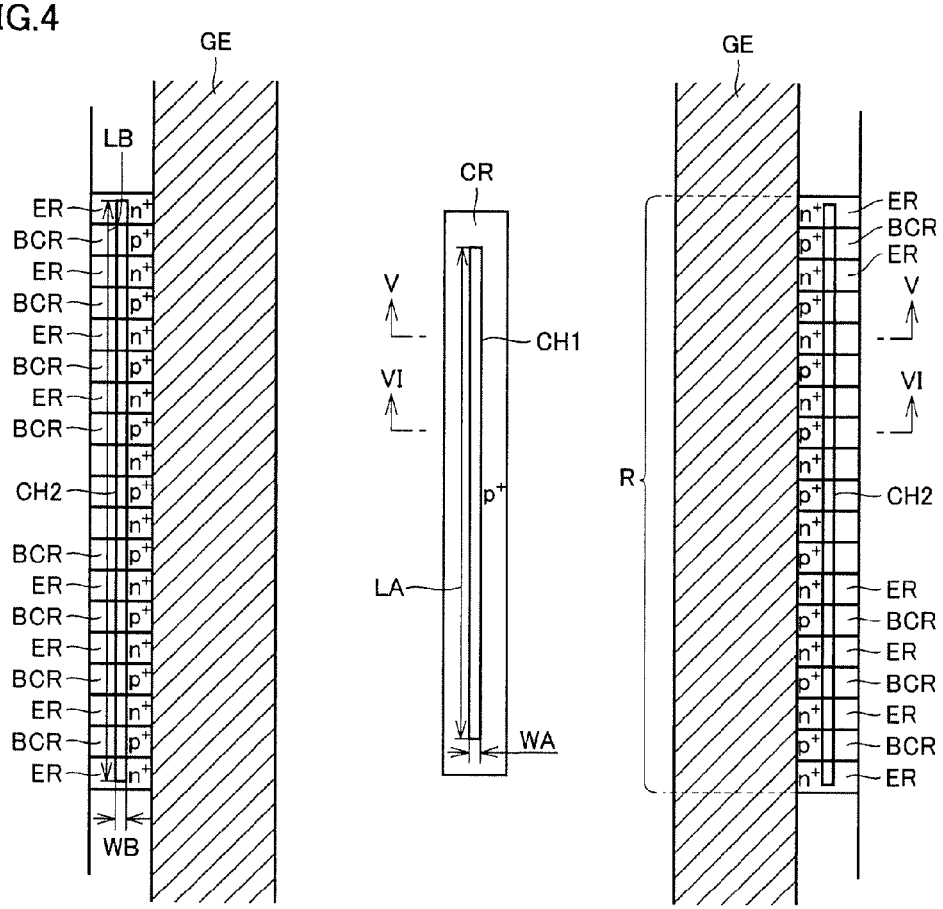
FIG. 4 is a plan view representing the IGBT shown in FIG. 3 in enlargement.

Referring to FIG. 4, both contact recesses CH1, CH2 have a line contact (slit contact) structure. This line contact structure is a structure which has an approximately rectangular shape (including the shape having rounded corners) in a plan view and has a length of one side of the approximately rectangular contact recess (for example, length LA, LB) being longer than or equal to twice a length of the other side (for example, line width WA, WB).

Since contact recess CH1 is formed so as to reach p⁺ collector region CR, plug layer PR1 filling contact recess CH1 is connected to p⁺ collector region CR.

A plurality of n⁺ emitter regions ER and a plurality of p⁺ base contact regions BCR are arranged alternately one another along a gate width direction (upward and downward directions in the drawing) in one IGBT. Contact recess CH2 on the emitter side is formed so as to reach each of the plurality of n⁺ emitter regions ER and the plurality of p⁺ base contact regions BCR. Therefore, plug layer PR2 filling contact recess CH2 is connected to each of the plurality of n⁺ emitter regions ER and the plurality of p⁺ base contact regions BCR.

A ratio (collector contact area/collector active area: SB12/SA12) of an area of a collector connection portion between p⁺ collector region CR and plug layer PR1 (collector contact area: SB12) to an area of p⁺ collector region CR (collector active area: SA12) on the main surface of semiconductor substrate SUB of the breakdown voltage-prioritized IGBT is larger than a ratio (contact area on p⁺ region/p⁺ region area: SB11/SA11) of an area of an emitter connection portion between p⁺ base contact regions BCR and plug layer PR2 (contact area on p⁺ region: SB11) to an area of p⁺ base contact regions BCR (p⁺ region area: SA11) on the main surface of semiconductor substrate SUB of the same IGBT.

Here, the area of p⁺ collector region CR (collector active area) corresponds to an area of p⁺ collector region CR surrounded by element separation structure ES. Further, the ratio (contact area on p⁺ region/p⁺ region area: SB11/SA11) is defined by the p⁺ region area and the contact area on the p⁺ region sandwiched between n⁺ emitter regions ER at opposite ends in an arrangement region R in which the plurality of n⁺ emitter regions ER and the plurality of p⁺ base contact regions BCR are aligned in the gate width direction as shown in FIG. 4.

In other words, the area of p⁺ base contact regions BCR (p⁺ region area) described above is a sum of the area of the plurality of p⁺ base contact regions BCR sandwiched between n⁺ emitter regions ER located at opposite ends in arrangement region R shown in FIG. 4. Further, the area of the connection portion between plug layer PR2 and p⁺ base contact regions BCR (the contact area on the p⁺ region) described above is a sum of the area of the connection portion between p⁺ base contact regions BCR and plug layer PR2 sandwiched between n⁺ emitter regions ER located at opposite ends of arrangement region R shown in FIG. 4.

Here, the collector connection portion between p⁺ collector region CR and plug layer PR1 (the connection portion at contact recess CH1) in the breakdown voltage-prioritized IGBT has a line contact structure. Further, the emitter connection portion between p⁺ base contact regions BCR and plug layer PR2 (the connection portion at contact recess CH2) in the same IGBT also has a line contact structure.

Next, a study conducted by the inventors on a relationship between the ratios described above and the characteristics of the IGBT will be described with reference to FIGS. 7 to 12.

Figure 8:
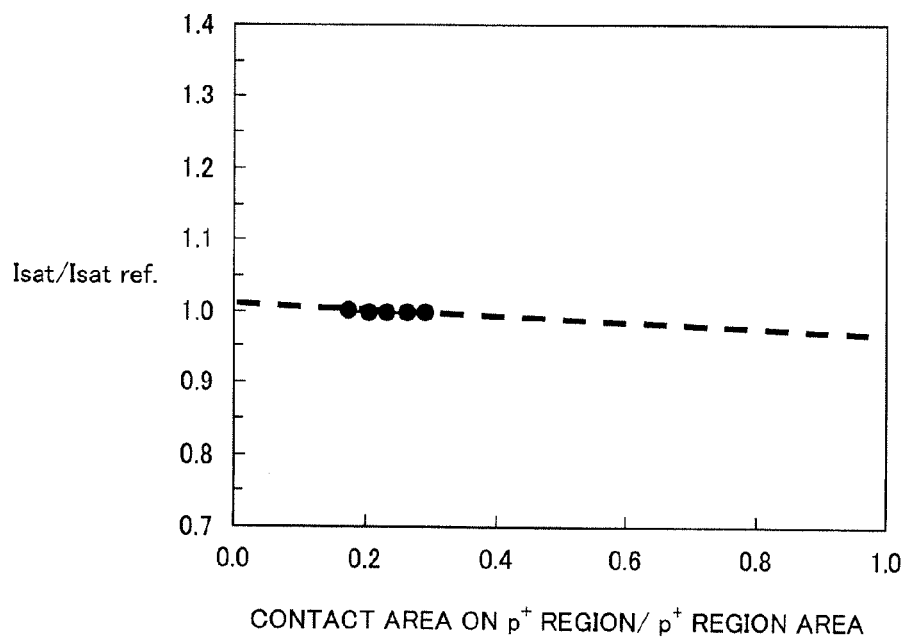
FIG. 8 represents a relationship between a ratio of a contact area to an area in the base contact region of the semiconductor device and a saturation current in accordance with the first embodiment.
Figure 9:
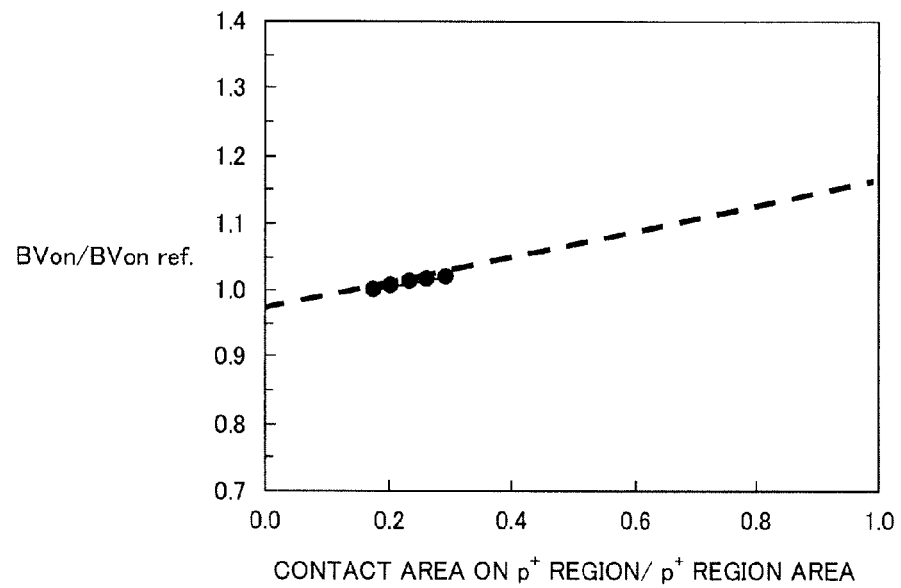
FIG. 9 represents a relationship between a ratio of a contact area to an area in the base contact region of the semiconductor device and an on-state breakdown voltage in accordance with the first embodiment.

Firstly, the inventors conducted a research on changes in the characteristics (a linear current, a saturation current, and an on-state breakdown voltage) of the IGBT due to changes in the ratio (contact area on p⁺ region/p⁺ region area: SB11/SA11) described above. This study was conducted for the IGBT having the configuration shown in FIG. 4 by changing only the ratio (contact area on p⁺ region/p⁺ region area) while fixing the ratio (collector contact area/collector active area: SB12/SA12). The results are shown in FIGS. 7 to 9.

Figure 7:
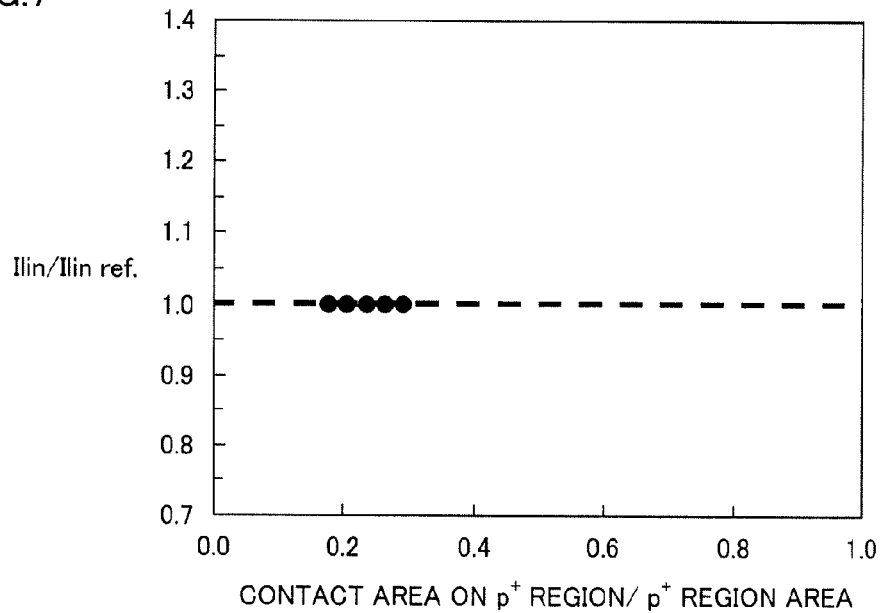
FIG. 7 represents a relationship between a ratio of a contact area to an area in a base contact region of the semiconductor device and a linear current in accordance with the first embodiment.

It was found out from the result shown in FIG. 7 that there was almost no change in the linear current even with a change in the ratio (contact area on p⁺ region/p⁺ region area: SB11/SA11) described above, but found out from the result shown in FIG. 8 that setting the ratio (contact area on p⁺ region/p⁺ region area: SB11/SA11) described above to be small improves the saturation current. On the other hand, it was found out from the result shown in FIG. 9 that setting the ratio (contact area on p⁺ region/p⁺ region area: SB11/SA11) described above to be large improves the on-state breakdown voltage.

Further, the inventors also conducted a research on changes in the characteristics (a linear current, a saturation current, and an on-state breakdown voltage) of the IGBT due to changes in the ratio (collector contact area/collector active area: SB12/SA12) described above. This study was conducted for the IGBT having the configuration shown in FIG. 4 by changing only the ratio (collector contact area/collector active area: SB12/SA12) described above while fixing the ratio (contact area on p⁺ region/p⁺ region area: SB11/SA11) described above. The results are shown in FIGS. 10 to 12.

Figure 10:
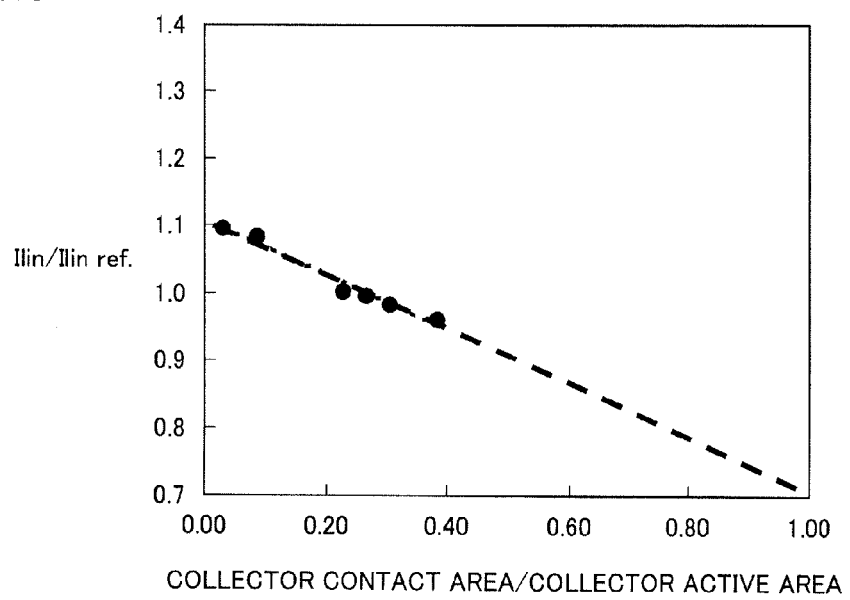
FIG. 10 represents a relationship between a ratio of a contact area to an area in a collector region of the semiconductor device and a linear current in accordance with the first embodiment.
Figure 11:
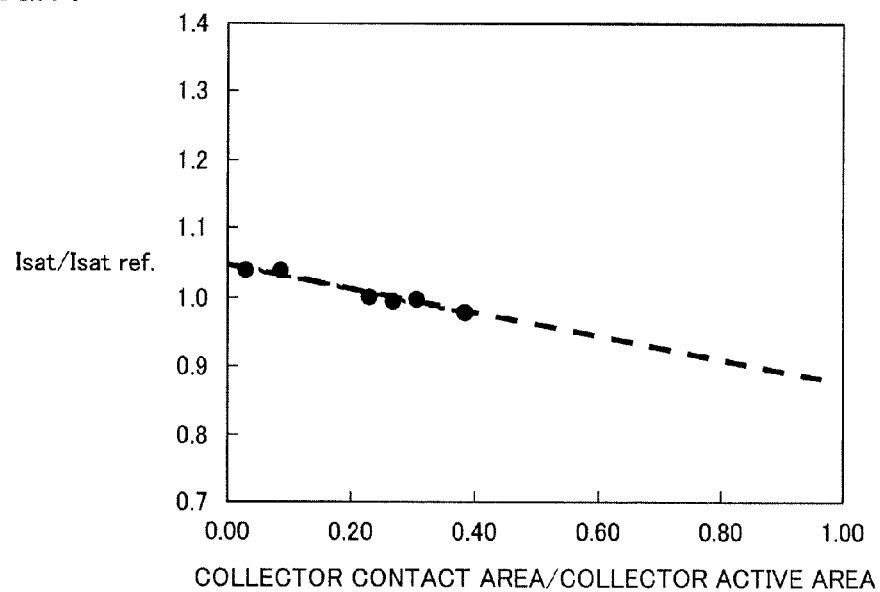
FIG. 11 represents a relationship between a ratio of a contact area to an area in the collector region of the semiconductor device and a saturation current in accordance with the first embodiment.
Figure 12:
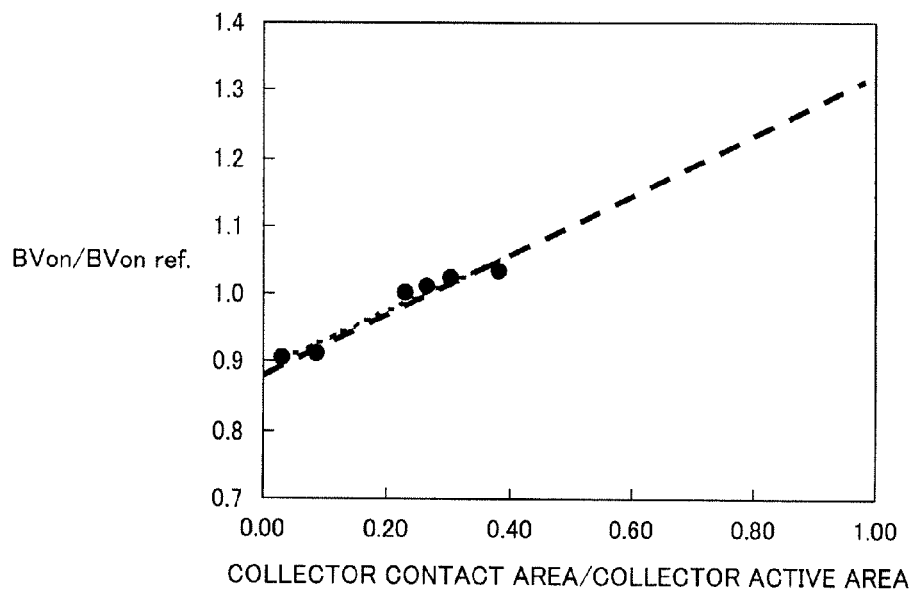
FIG. 12 represents a relationship between a ratio of a contact area to an area in the collector region of the semiconductor device and an on-state breakdown voltage in accordance with the first embodiment.

It was found out from the results shown in FIGS. 10 and 11 that setting the ratio (collector contact area/collector active area: SB12/SA12) described above to be small improves both the linear current and saturation current. Further, from the result shown in FIG. 12, it was found out that setting the ratio (collector contact area/collector active area: SB12/SA12) described above to be large improves the on-state breakdown voltage.

Further, it was found out that changing both the ratio (contact area on p⁺ region/p⁺ region area: SB11/SA11) and ratio (collector contact area/collector active area: SB12/SA12) leads to approximately the same result as the case where only the ratio (collector contact area/collector active area: SB12/SA12) shown in FIGS. 10 to 12 is changed.

From the results shown in FIGS. 7 to 12 described above, it was found out that, in the breakdown voltage-prioritized IGBT, setting the ratio (collector contact area/collector active area: SB12/SA12) to be larger than the ratio (contact area on p⁺ region/p⁺ region area: SB11/SA11) is effective in view of improving the on-state breakdown voltage. Further, it was found out that, in the current-prioritized IGBT, setting the ratio (collector contact area/collector active area: SB12/SA12) to be smaller than the ratio (contact area on p⁺ region/p⁺ region area: SB11/SA11) is effective in view of improving the linear current and saturation current.

Next, the reason why the results shown in FIGS. 7 to 12 could be obtained will be considered with reference to FIGS. 13 to 17.

Figure 13:
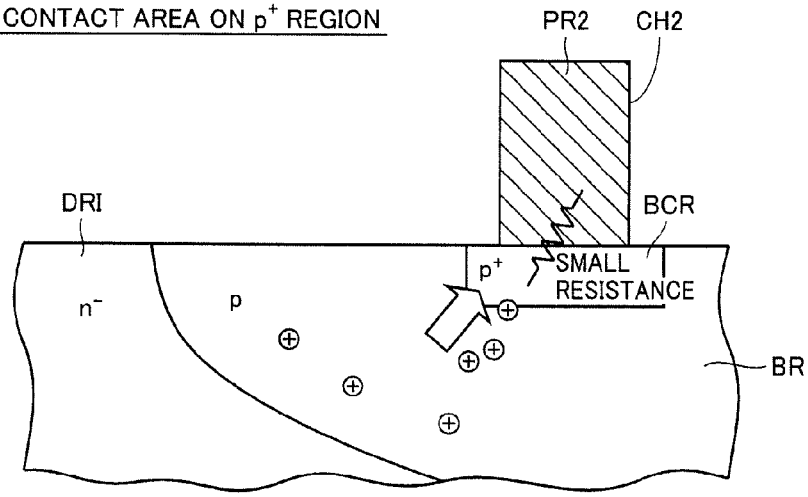
FIG. 13 is a schematic cross-sectional view illustrating that the characteristic of the IGBT changes when a contact area in the base contact region is large.

Referring to FIG. 13, when the contact area between p⁺ base contact region BCR and plug layer PR2 is large, the contact resistance between plug layer PR2 and p⁺ base contact region BCR becomes small, so that the efficiency of drawing holes (positive holes) from p-type region BR becomes high. Accordingly, it is considered that accumulation of the holes in p-type region BR is suppressed to improve the on-state breakdown voltage.

Figure 14:
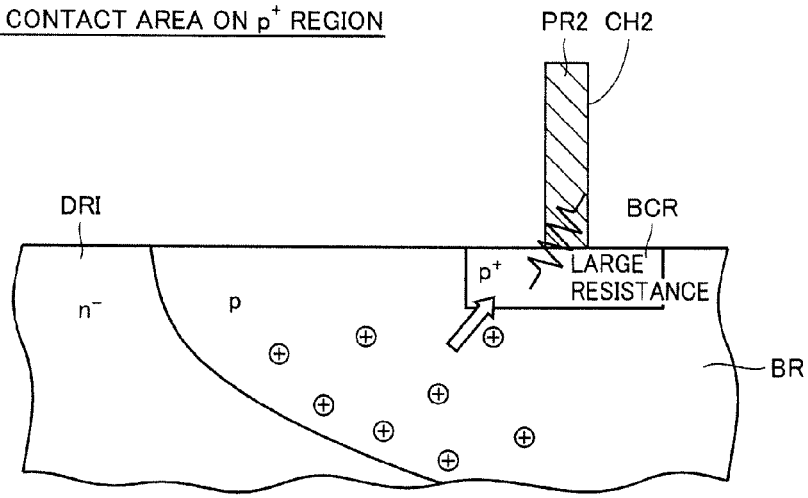
FIG. 14 is a schematic cross-sectional view illustrating that the characteristic of the IGBT changes when a contact area in the base contact region is small.

Referring to FIG. 14, on the other hand, when the contact area between p⁺ base contact region BCR and plug layer PR2 is small, the contact resistance between plug layer PR2 and p⁺ base contact region BCR becomes large, so that the efficiency of drawing holes from p-type region BR becomes low. Accordingly, it is considered that, the holes are readily accumulated in p-type region BR, and the base potential is raised from the ground potential, so that improvement in the on-state breakdown voltage was suppressed.

Figure 15:
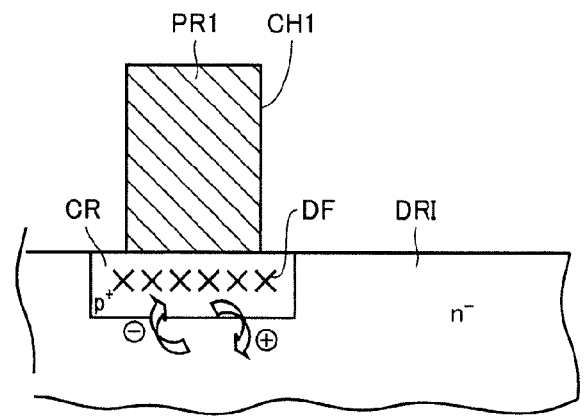
FIG. 15 is a schematic cross-sectional view illustrating that the characteristic of the IGBT changes when a contact area in the collector region is large.
Figure 16:
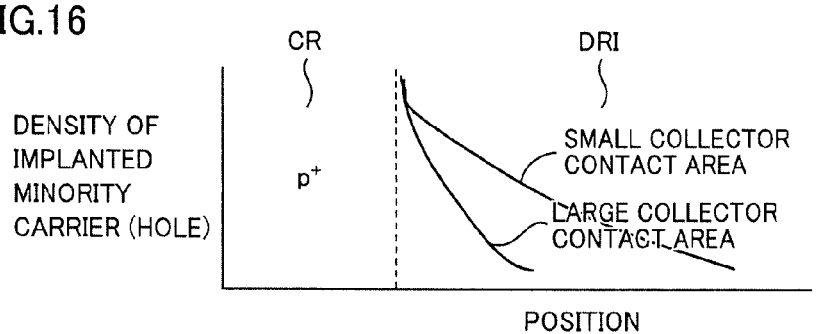
FIG. 16 represents distribution of a minority carrier density in the case where a forward bias is exerted to the collector region.

Referring to FIG. 15, the etching damage during formation of contact recess CH1 and silicidation of a barrier metal (not illustrated) formed in contact recess CH1 in the main surface of the semiconductor substrate cause crystal defects DF on the surface of collector region CR. The number of crystal defects DF is proportional to the size of the collector contact area. In these crystal defects DF, recombination between holes and electrons occur to eliminate the holes. Accordingly, as shown in FIG. 16, the number of holes (density) to be implanted from plug layer PR1 through collector region CR to drift region DRI is changed in accordance with the number of crystal defects DF. It is considered that the resistance of drift region DRI by conductivity modulation is changed in accordance with the hole density so that the current is increased or decreased. Even in the case where the metal silicide is applied, the effect of the crystal defect due to the etching damage remains, thus a similar effect can be obtained even being slight in degree.

In other words, it is considered that the improvement in the current is suppressed since the number of crystal defects DF on the surface of collector region CR becomes larger and the number of holes to be implanted from plug layer PR1 through collector region CR to drift region DRI is reduced as the collector contact area becomes larger.

Figure 17:
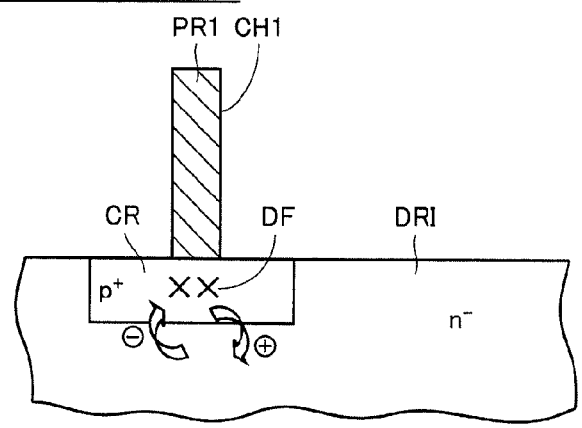
FIG. 17 is a schematic cross-sectional view illustrating that the characteristic of the IGBT changes when a contact area in the collector region is small.

Referring to FIG. 17, on the other hand, when the collector contact area is small, the number of crystal defects DF on the surface of collector region CR becomes small, so that the number of holes to be implanted from plug layer PR1 through collector region CR to drift region DRI is increased. Accordingly, it is considered that the resistance of drift region DRI due to conductivity modulation is drastically lowered to increase the current.

Next, the effect of the present embodiment will be described.

As described above, in the present embodiment, the ratio (collector contact area/collector active area: SB12/SA12) is larger than the ratio (contact area on p⁺ region/p⁺ region area: SB11/SA11). Therefore, the on-state breakdown voltage can be improved in breakdown voltage-prioritized IGBT on High Side. In other words, without performing large-scaled changes, such as a change in an element size, a change in an implantation layout, and a change in an impurity implantation condition, and optimization, improvements in characteristics such as current improvement and on-state breakdown voltage improvement of the lateral IGBT can be performed while suppressing the burden on development with a small-scaled change such as a change in the contact size.

Since the change in the contact size can be controlled with only the change in the contact mask, readjustment after an experimental manufacture of the contact can be performed at low cost.

Further, in the present embodiment, as shown in FIGS. 3 and 4, the line contact structure extends continuously without interruption. Accordingly, unevenness in the characteristic due to positional and dimensional deviation of contact recesses CH1, CH2 can be suppressed.

In the IGBT described above, both contact recesses CH1, CH2 on the collector side and emitter side have the line contact structure. Accordingly, using the line contact structure causes the contact area to be larger than the case where the hole contact structure is used, thus the control range of the characteristic in the IGBT can be widened.

Figure 18:
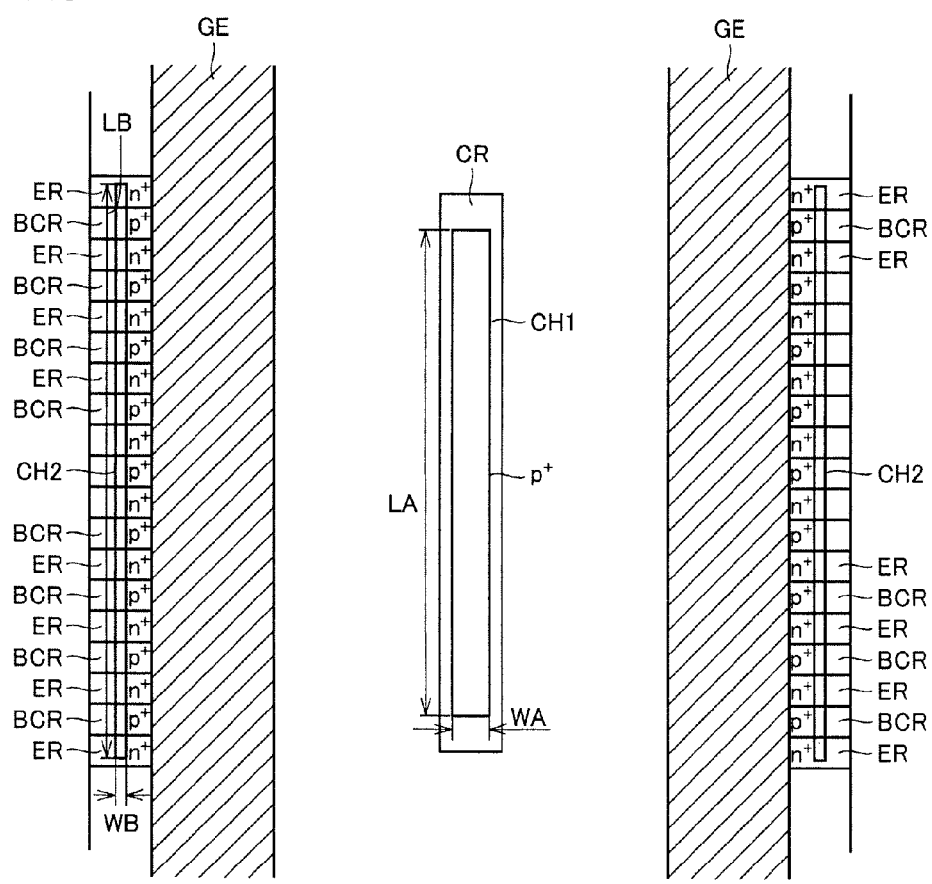
FIG. 18 is a schematic plan view representing a configuration of the IGBT in the case where a contact on a collector side has a line contact structure with a large line width and a contact on an emitter side has a line contact structure with a small line width.

Further, in the IGBT of the present embodiment, as shown in FIG. 18, a line width WA of the connection portion between plug layer PR1 and p⁺ collector region CR is preferably larger than a line width WB of the connection portion between plug layer PR2 and p⁺ base contact regions BCR.

Figure 19:
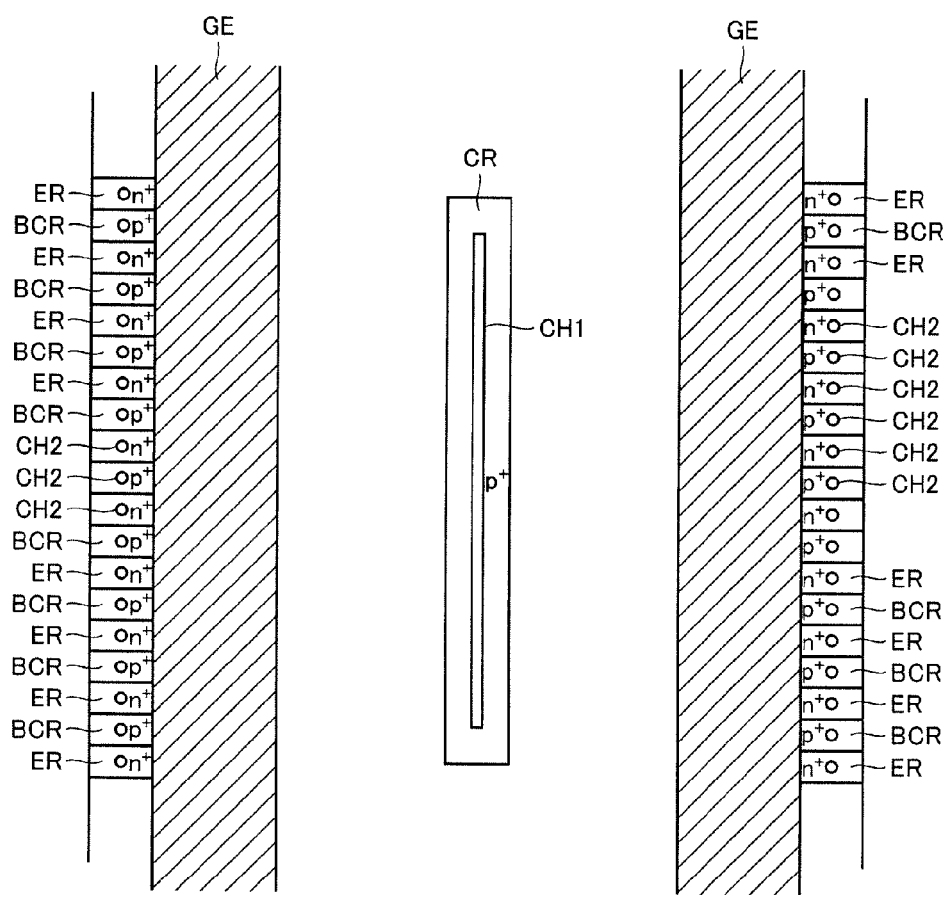
FIG. 19 is a schematic plan view representing a configuration of the IGBT in the case where a contact on a collector side has a line contact structure and a contact on an emitter side has a hole contact structure.

Further, in the IGBT of the present embodiment, as shown in FIG. 19, contact recess CH1 on the collector side may have a line contact structure, and contact recesses CH2 on the emitter side may have a hole contact structure. Also in this case, contact recess CH1 on the collector side has a line contact structure, so that the contact area can be set larger than the case where the hole contact structure is used. Accordingly, a control range of the characteristic of the IGBT can be widened.

Figure 20:
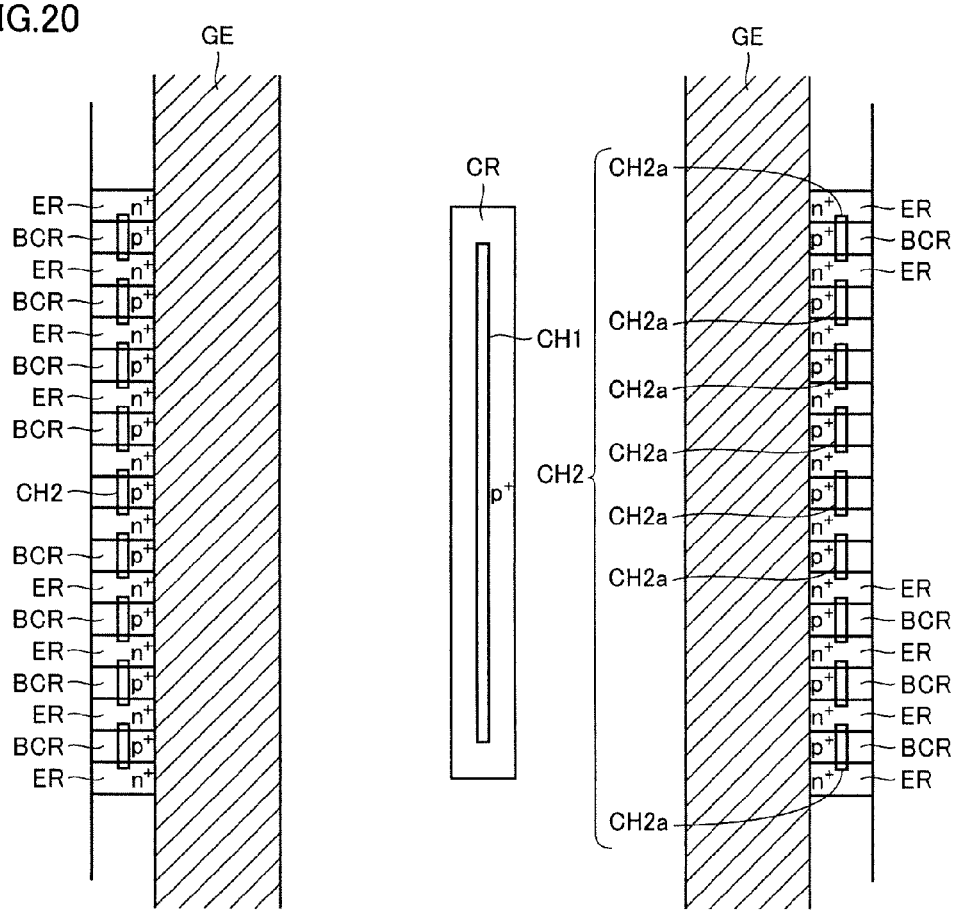
FIG. 20 is a schematic plan view representing a configuration of the IGBT in the case where a contact on a collector side has a line contact structure and a contact on an emitter side has a divided line contact structure.

Further, in the IGBT of the present embodiment, as shown in FIG. 20, contact recess CH1 on the collector side may have a line contact structure, and contact recess CH2 on the emitter side may have a divided line contact structure. Here, the divided line structure is a contact structure in which contact recess CH2 on the emitter side have a plurality of line contact portions CH2a which are separated from one another and arranged in series. Each of the plurality of line contact portions CH2a has a line contact structure. In other words, each of the plurality of line contact portions CH2a has a rectangular shape in a planar view shown in FIG. 20, and has a structure in which a length of one side in the planar view is larger than or equal to twice a length of the other one side. Also in this case, since contact recess CH1 on the collector side has a line contact structure, the contact area can be larger than the case where the divided line contact structure is used, so that the control range of the characteristic of the IGBT can be widened.

Figure 21:
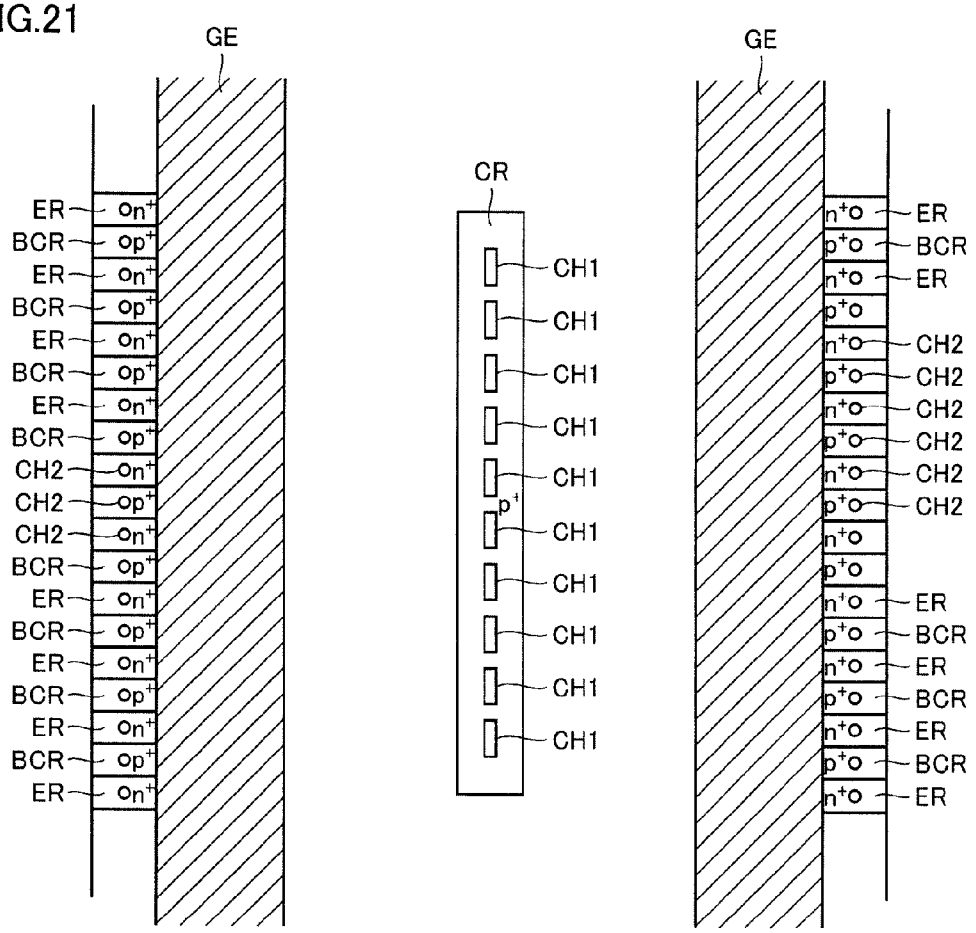
FIG. 21 is a schematic plan view representing a configuration of the IGBT in the case where a contact on a collector side has a divided line contact structure and a contact on an emitter side has a hole contact structure.

Further, in the IGBT of the present embodiment, as shown in FIG. 21, contact recesses CH1 on the collector side may have a divided line contact structure, and contact recesses CH2 on the emitter side may have a hole contact structure. Also in this case, since contact recesses CH1 on the collector side have a divided line contact structure, the contact area can be larger than the case where the hole contact structure is used, so that the control range of the characteristic of the IGBT can be widened.

Figure 22:
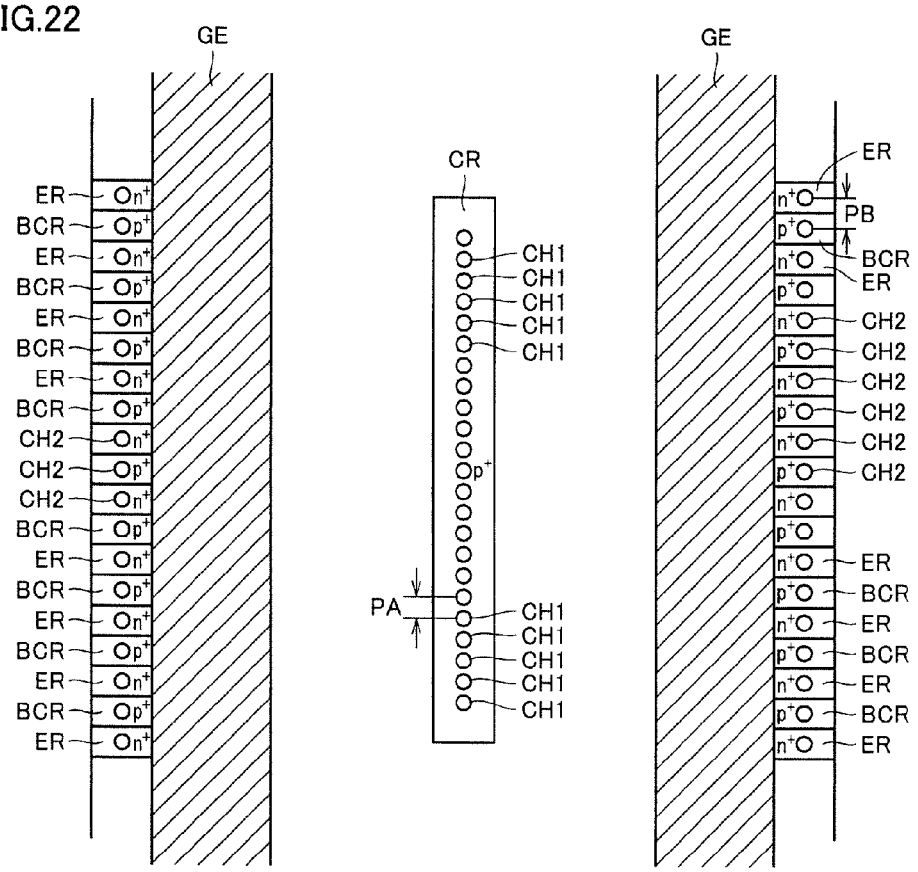
FIG. 22 is a schematic plan view representing a configuration of the IGBT in the case where a contact on a collector side has a hole contact structure with a small hole pitch and a contact on an emitter side has a hole contact structure with a large hole pitch.

Further, in the IGBT of the present embodiment, as shown in FIG. 22, both contact recesses CH1, CH2 on the collector side and emitter side may have a hole contact structure. In this case, a hole pitch PA of contact recesses CH1 on the collector side is preferably smaller than a hole pitch PB of contact recesses CH2 on the emitter side. Also in this case, since hole pitch PA of contact recesses CH1 on the collector side is small, the contact area can be set larger than the case where the hole pitch is large, so that a control width of the characteristic of the IGBT can be widened. In this configuration, the area of contact recesses CH1 on the collector side and the area of contact recesses CH2 on the emitter side are preferably equal.

Figure 23:
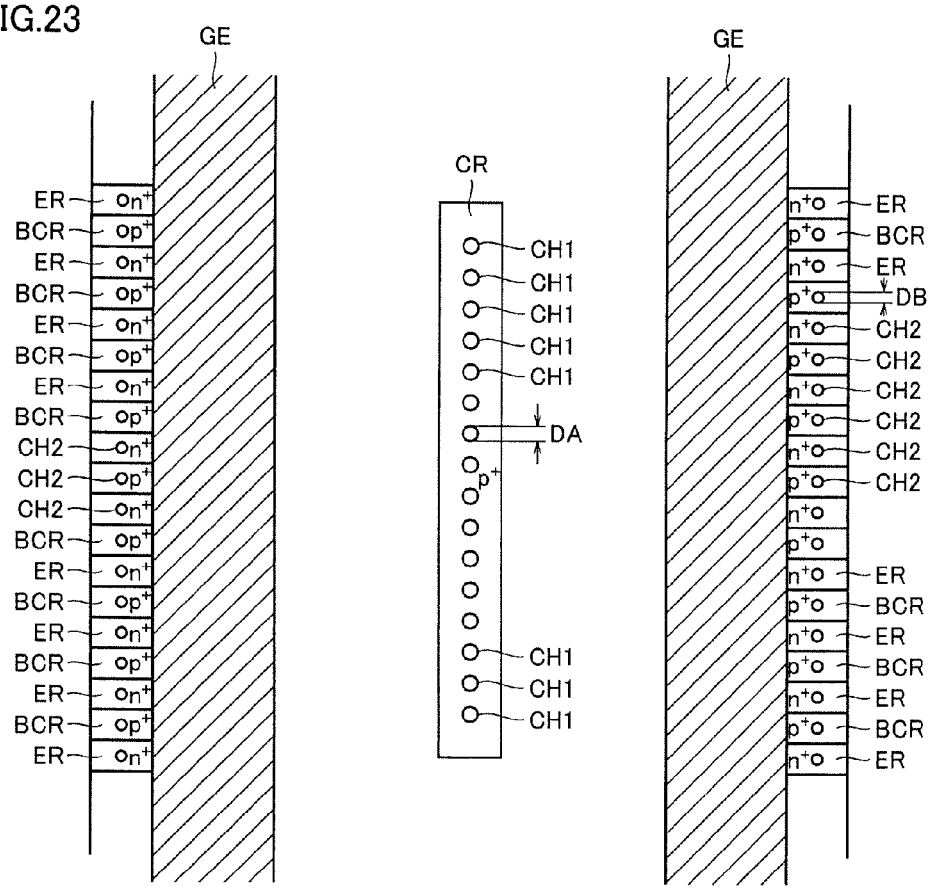
FIG. 23 is a schematic plan view representing a configuration of the IGBT in the case where a contact on a collector side has a hole contact structure with a large hole diameter and a contact on an emitter side has a hole contact structure with a small hole diameter.

Further, in the IGBT of the present embodiment, as shown in FIG. 23, both contact recesses CH1, CH2 on the collector side and emitter side may have a hole contact structure. In this case, a diameter DA of each hole of contact recesses CH1 on the collector side is preferably larger than a diameter DB of each hole of contact recesses CH2 on the emitter side. Also in this case, since diameter DA of each hole of contact recesses CH1 on the collector side is large, the contact area can be larger than the case where the diameter of the hole is small, so that the control range of the characteristic of the IGBT can be widened. In this configuration, the hole pitch of contact recesses CH1 on the collector side and the hole pitch of contact recesses CH2 on the emitter side are preferably equal.

Figure 24:
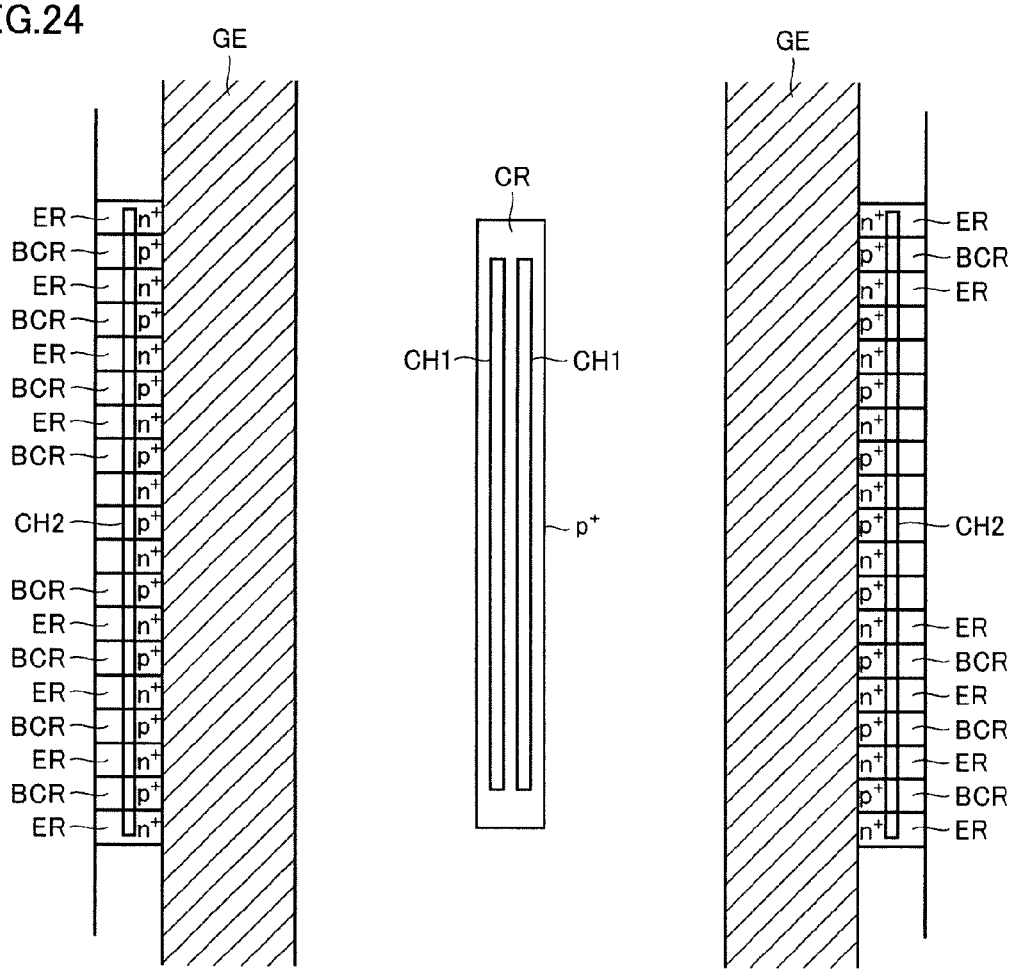
FIG. 24 is a schematic plan view representing a configuration of the IGBT in the case where a contact on a collector side has a two-rows line contact structure and a contact on an emitter side has a one-row line contact structure.

Further, in the IGBT of the present embodiment, as shown in FIG. 24, contact recesses CH1 on the collector side may have a two-rows line contact structure, and contact recess CH2 on the emitter side may have a one-row line contact structure. Also in this case, since the number of rows of contact recesses CH1 on the collector side is larger than the number of rows of contact recess CH2 on the emitter side, the contact area on the collector side can be larger, so that the control range of the characteristic of the IGBT can be widened. In this configuration, not limited to the case where contact recesses CH1 on the collector side have two rows and contact recess CH2 on the emitter side has one row, it is all necessary that the number of rows of the line contact structure of contact recesses CH1 on the collector side is larger than the number of rows of the contact structure of contact recess CH2 on the emitter side. Further, contact recesses CH1 on the collector side may have a two-rows divided line contact structure or a two-rows hole contact structure, and contact recess CH2 on the emitter side may have a one-row divided line contact structure or a one-row hole contact structure.

The configurations of the IGBT shown in FIGS. 18 to 24 described above may be different in the configurations of contact recesses CH1, CH2 as compared to the configuration of the IGBT shown in FIG. 4, and configurations other than those are the same as the configuration shown in FIG. 4. Therefore, the elements among the configurations of FIGS. 18 to 24 which are the same as those of the configuration shown in FIG. 4 have the same reference numerals allotted, and description thereof will not be repeated.

Second Embodiment

Figure 25:
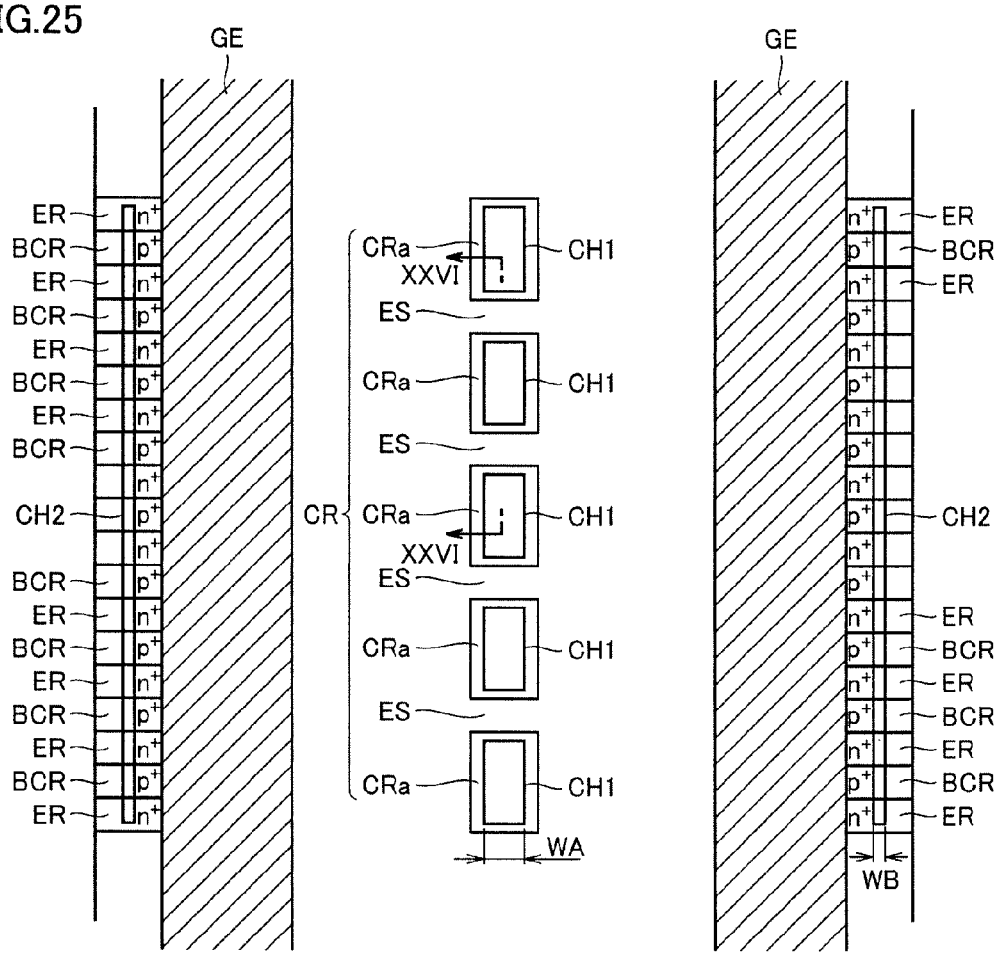
FIG. 25 is a schematic plan view representing a configuration of the IGBT in a semiconductor device in accordance with a second embodiment, where a collector region is partially spaced (segmented) by an element separation structure, and a contact on a collector side has a line contact structure with a large line width, and a contact on an emitter side has a line contact structure with a small line width.
Figure 26:
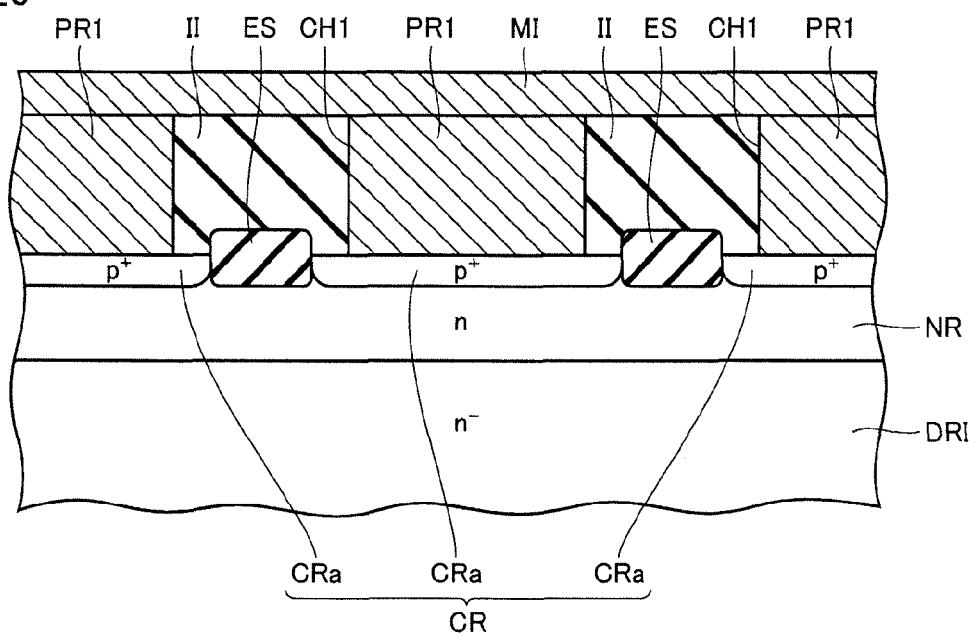
FIG. 26 is a schematic cross-sectional view taken along the line XXVI-XXVI of FIG. 25.

Referring to FIGS. 25 and 26, the configuration of the present embodiment is different from the configuration shown in FIG. 4 in that $p^+$ collector region CR is partially spaced (segmented) by element separation structure ES. In other words, in one IGBT, $p^+$ collector region CR is constituted of a plurality of $p^+$ collector region portions (collector active regions) CRa separated by element separation structure ES. As described in the first embodiment, element separation structure ES may be a silicon oxide film formed of LOCOS or may be STI.

In the IGBT described above, both contact recesses CH1, CH2 on the collector side and emitter side have a line contact structure. One $p^+$ collector region CRa is provided with one line contact portion (recess) CH1, and line contact portion CH1 is not provided on each element separation structure ES sandwiched between $p^+$ collector region portions CRa. Line width WA of the connection portion between plug layer PR1 and $p^+$ collector regions CR is preferably larger than line width WB of the connection portion between plug layer PR2 and $p^+$ base contact regions BCR.

The configuration of the present embodiment other than those described above is substantially the same as the configuration shown in FIG. 4. Therefore, the same elements have the same reference numerals allotted, and description thereof will not be repeated.

According to the present embodiment, since $p^+$ collector region CR is partially spaced by element separation structure ES, current can be improved. Further, since the configuration in which $p^+$ collector region CR is partially spaced by element separation structure ES can be manufactured by only changing a field mask, the configuration described above can be manufactured at low cost.

Further, in the IGBT shown in FIGS. 25 and 26, both contact recesses CH1, CH2 on the collector side and emitter side have a line contact structure. Using the line contact structure causes the contact area to be larger than the case where the contact structure is used, so that the control range of the characteristic of the IGBT can be widened.

In the IGBT shown in FIGS. 25 and 26, line width WA of the connection portion between plug layer PR1 and $p^+$ collector region CR is preferably larger than line width WB of the connection portion between plug layer PR2 and $p^+$ base contact regions BCR. Accordingly, the control range of the characteristic of the IGBT can be further widened.

Figure 27:
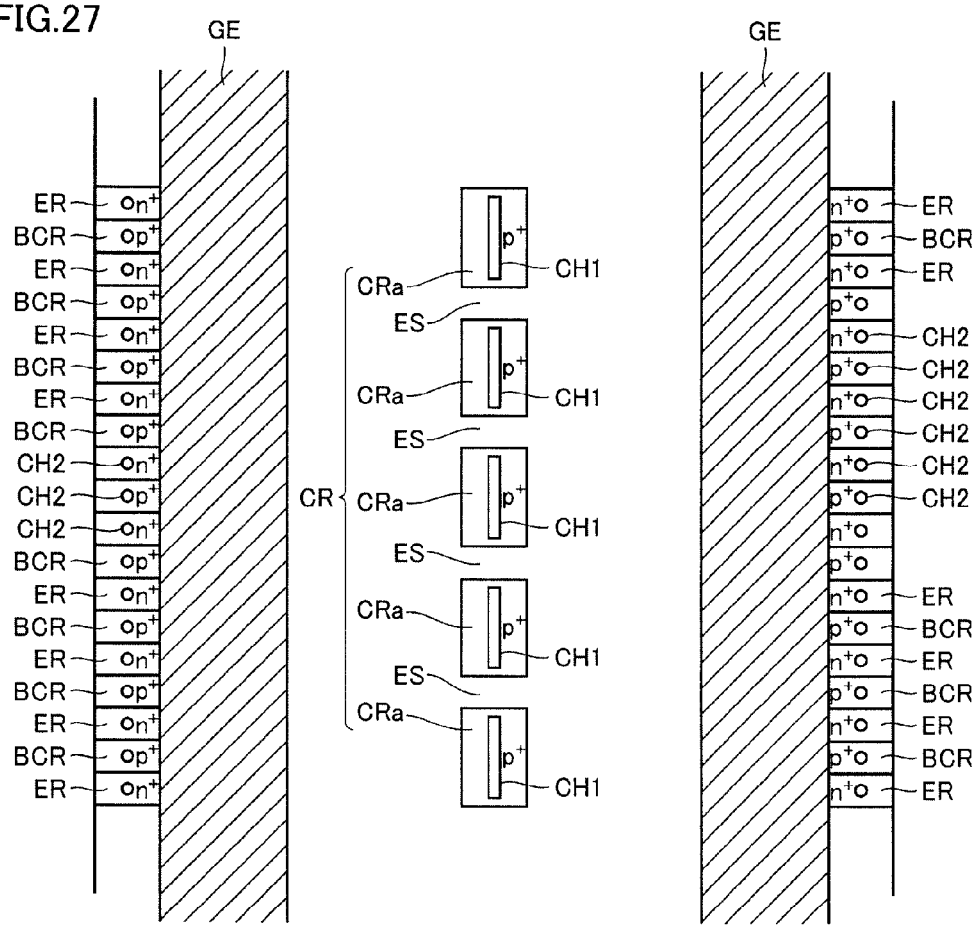
FIG. 27 is a schematic plan view representing a configuration of the IGBT in the case where the collector region is partially spaced (segmented) by the element separation structure, and a contact on a collector side has a line contact structure, and a contact on an emitter side has a hole contact structure.

Further, in FIGS. 25 and 26, the case where contact recess CH2 on the emitter side has a line contact structure is described. However, contact recess CH2 may have a hole contact structure as shown in FIG. 27. Also in this case, since contact recesses CH1 on the collector side have a line contact structure, the contact area can be larger than the case where the hole contact structure is used, so that the control range of the characteristic of the IGBT can be widened.

Figure 28:
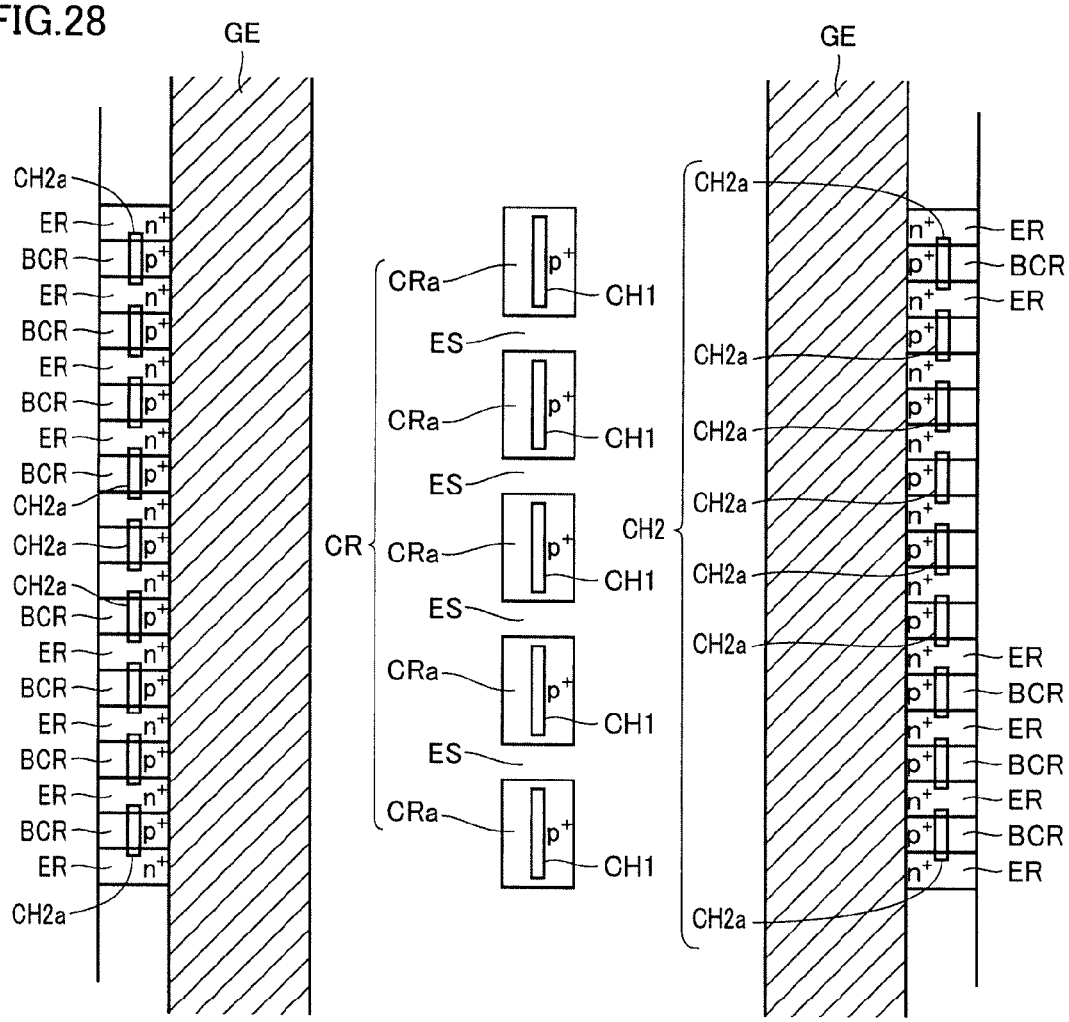
FIG. 28 is a schematic plan view representing a configuration of the IGBT in the case where the collector region is partially spaced (segmented) by the element separation structure, and a contact on a collector side has a line contact structure, and a contact on an emitter side has a divided line contact structure.

Further, as shown in FIG. 28, contact recesses CH1 on the collector side may have a line contact structure, and contact recesses CH2 on the emitter side may have a divided line contact structure. In other words, contact recess CH2 on the emitter side has a divided line contact structure having a plurality of line contact portions CH2a separated from one another and arranged in series. Also in this case, since contact recesses CH1 on the collector side have a line contact structure, the contact area can be larger than the case where the divided line contact structure is used, so that the control range of the characteristic of the IGBT can be widened.

Figure 29:
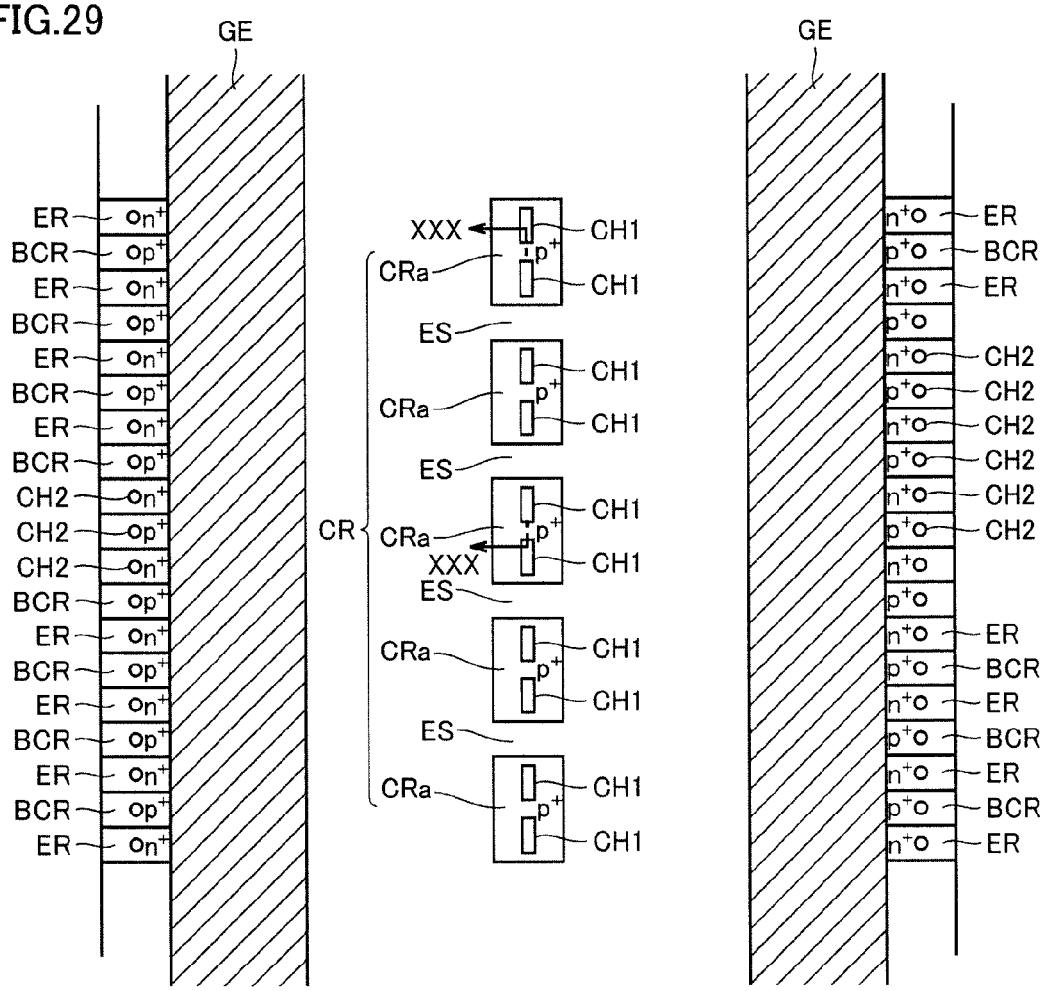
FIG. 29 is a schematic plan view representing a configuration of the IGBT in the case where the collector region is partially spaced (segmented) by the element separation structure, and a contact on a collector side has a divided line contact structure, and a contact on an emitter side has a hole contact structure.
Figure 30:
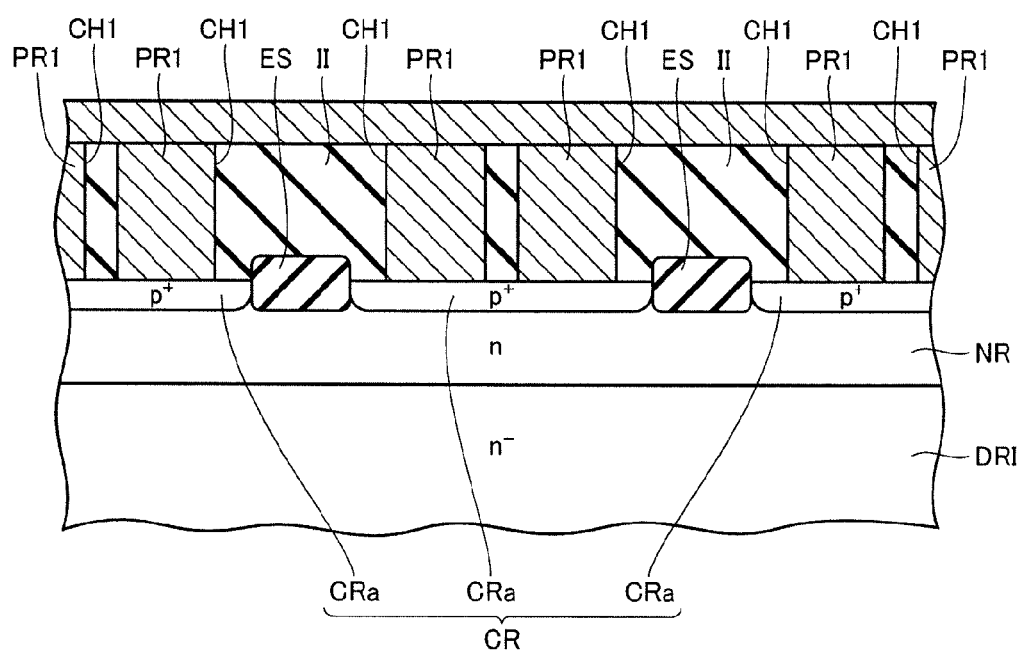
FIG. 30 is a schematic cross-sectional view taken along the line XXX-XXX of FIG. 29.

As shown in FIGS. 29 and 30, contact recesses CH1 on the collector side may have a divided line contact structure, and contact recesses CH2 on the emitter side may have a hole contact structure. Also in this case, since contact recesses CH1 on the collector side have a divided line contact structure, the contact area can be set larger than the case where the hole contact structure is used, so that the control range of the characteristic of the IGBT can be widened. The divided line contact structure here is a contact structure having a plurality of line contact portions CH1 separated from one another and arranged in series for one p+ collector region portion CRa.

Figure 31:
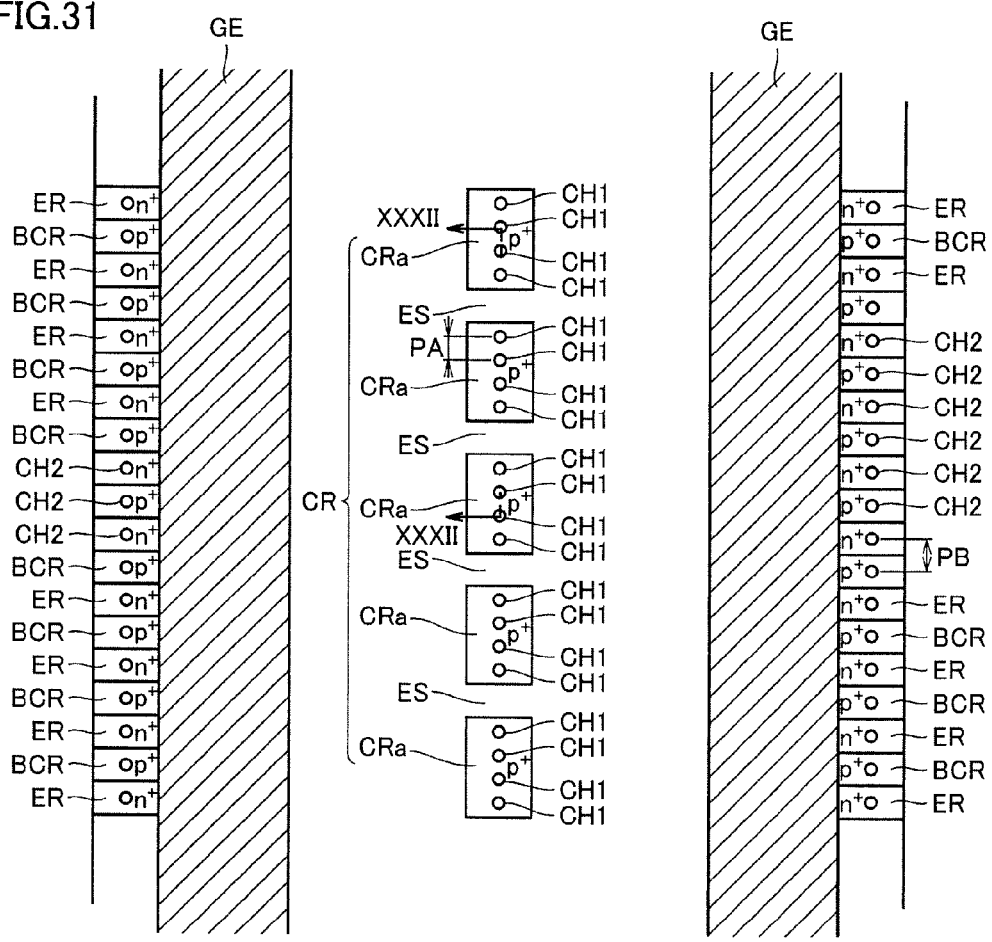
FIG. 31 is a schematic plan view representing a configuration of the IGBT in the case where the collector region is partially spaced (segmented) by the element separation structure, and a contact on a collector side has a hole contact structure with a small hole pitch, and a contact on an emitter side has a hole contact structure with a large hole pitch.
Figure 32:
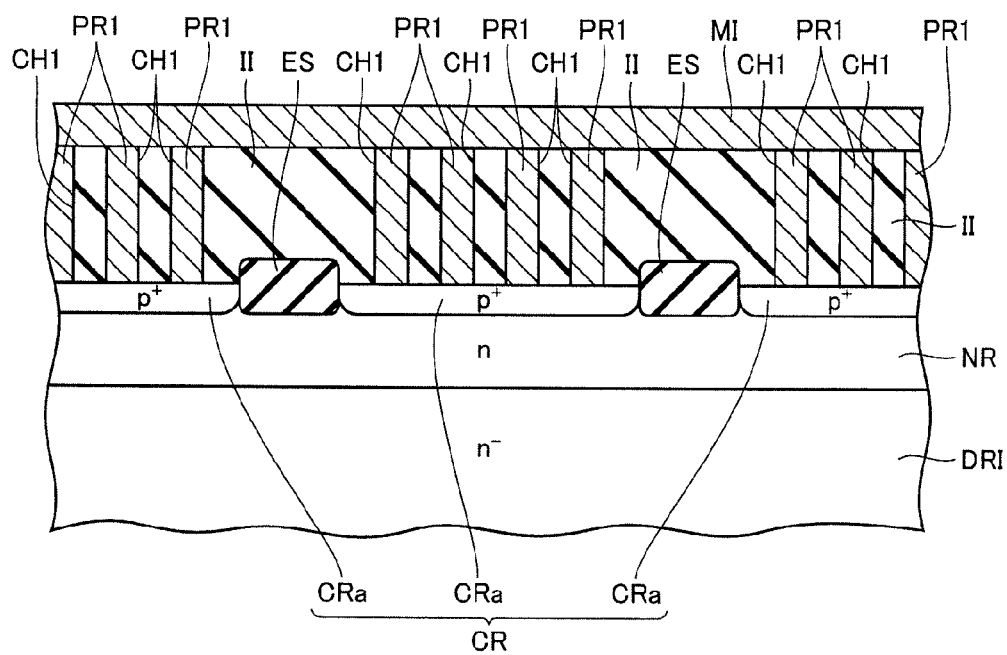
FIG. 32 is a schematic cross-sectional view taken along the line XXXII-XXXII of FIG. 31.

Further, as shown in FIGS. 31 and 32, both contact recesses CH1, CH2 on the collector side and emitter side may have a hole contact structure. In this case, a hole pitch PA of contact recesses CH1 on the collector side is preferably smaller than a hole pitch PB of contact recesses CH2 on the emitter side. Also in this case, since hole pitch PA of contact recesses CH1 on the collector side is small, the contact area can be larger than the case where the hole pitch is large, so that the control range of the characteristic of the IGBT can be widened.

Figure 33:
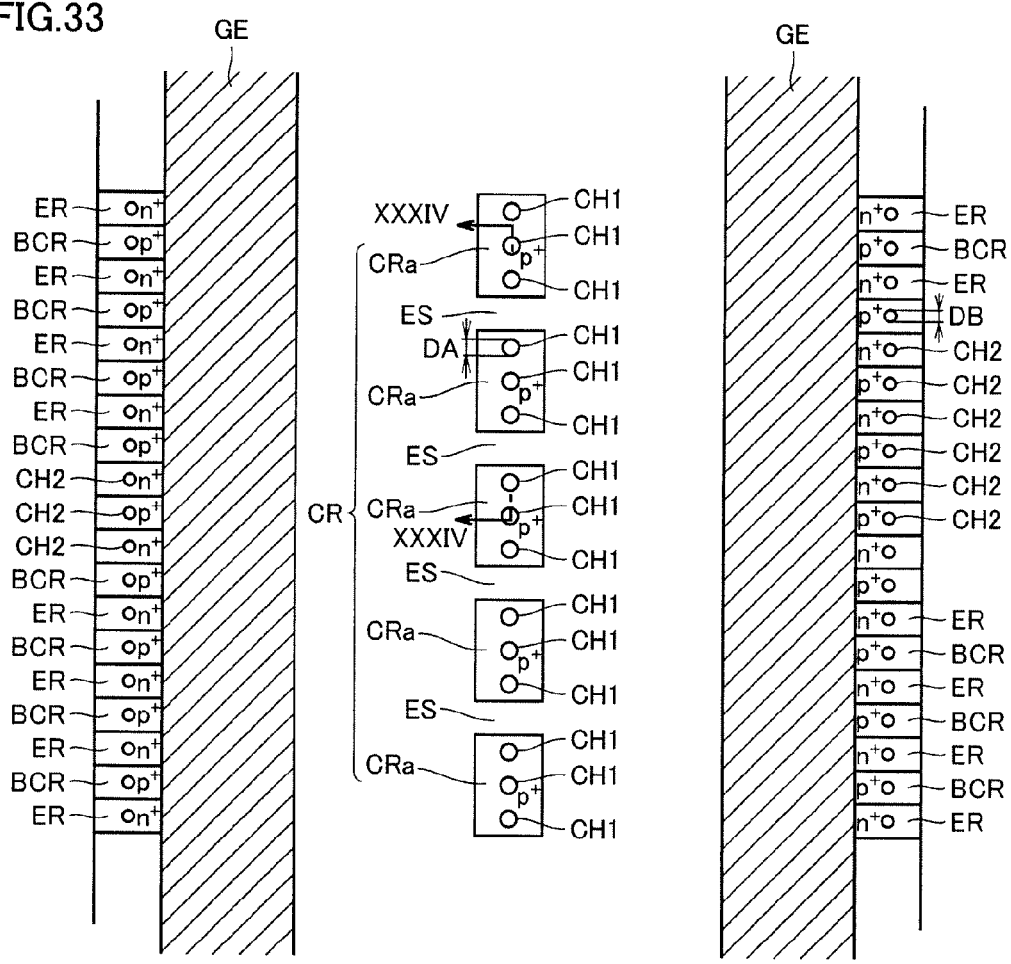
FIG. 33 is a schematic plan view representing a configuration of the IGBT in the case where the collector region is partially spaced (segmented) by the element separation structure, and a contact on a collector side has a hole contact structure with a large hole diameter, and a contact on an emitter side has a hole contact structure with a small hole diameter.
Figure 34:
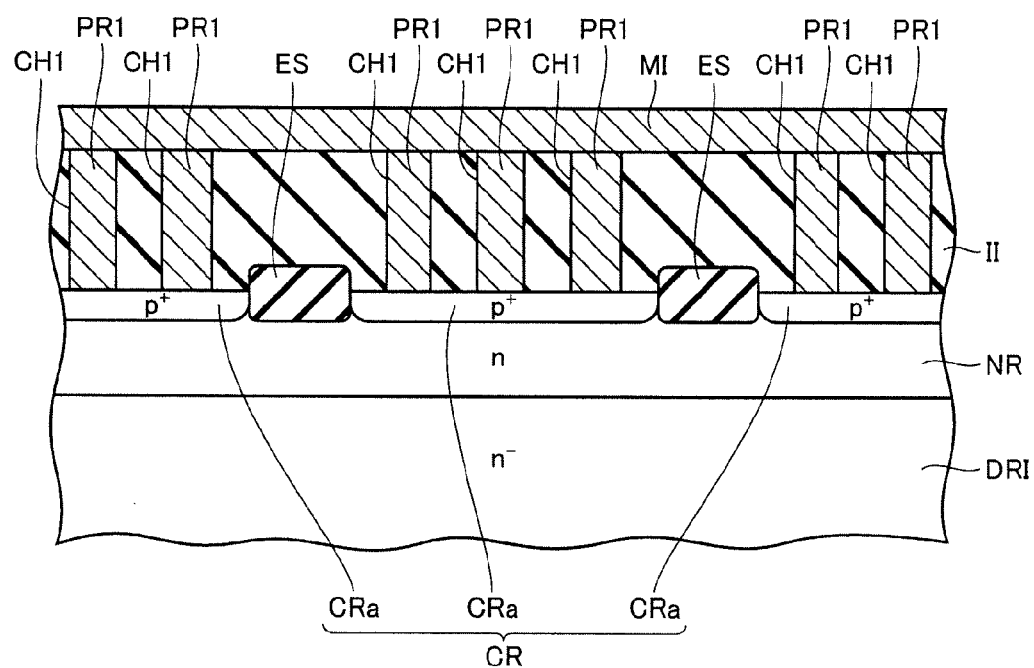
FIG. 34 is a schematic cross-sectional view taken along the line XXXIV-XXXIV of FIG. 33.

Further, as shown in FIGS. 33 and 34, both contact recesses CH1, CH2 on the collector side and emitter side may have a hole contact structure. In this case, diameter DA of the holes of contact recesses CH1 on the collector side is preferably larger than diameter DB of the holes of contact recesses CH2 on the emitter side. Also in this case, since diameter DA of holes of contact recesses CH1 on the collector side is large, the contact area can be larger than the case where the diameter of the holes is small, so that the control range of the characteristic of the IGBT can be widened.

Figure 35:
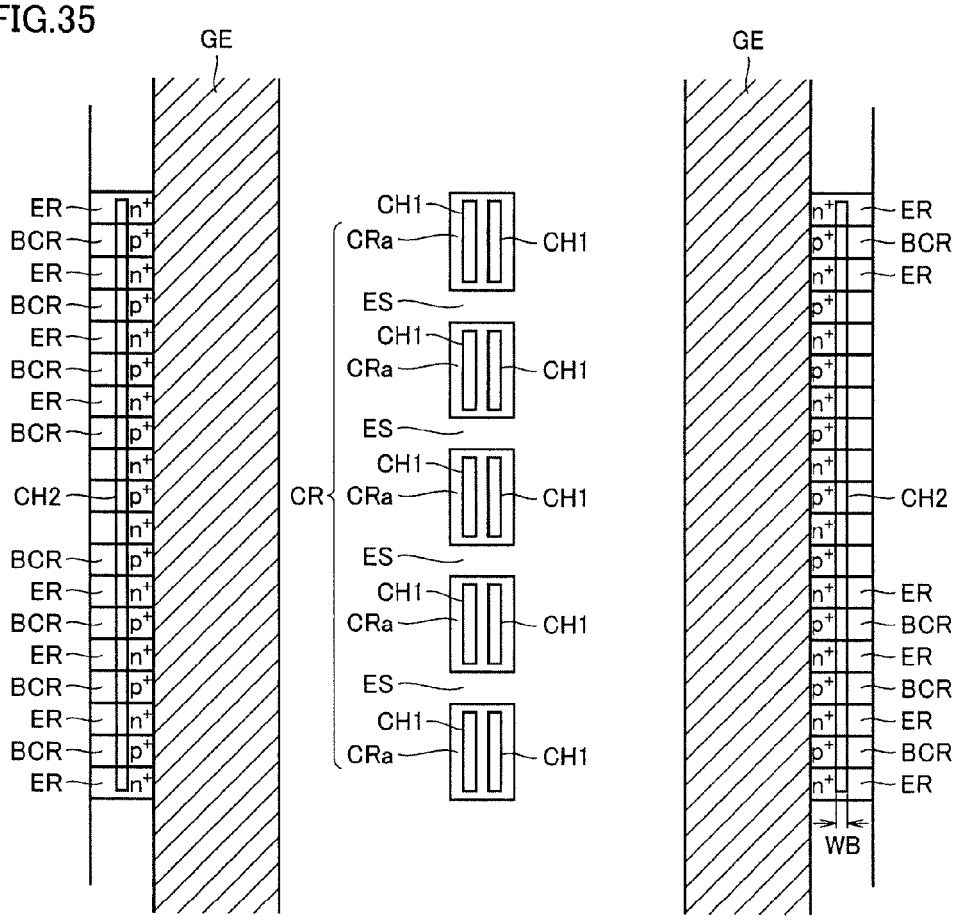
FIG. 35 is a schematic plan view representing a configuration of the IGBT in the case where the collector region is partially spaced (segmented) by the element separation structure, and a contact on a collector side has a two-rows line contact structure, and a contact on an emitter side has a one-row line contact structure.

Further, as shown in FIG. 35, contact recesses CH1 on the collector side may have a two-rows line contact structure, and contact recess CH2 on the emitter side may have one-row line contact structure. Also in this case, since the number of rows of contact recesses CH1 on the collector side is larger than the number of rows of contact recess CH2 on the emitter side, the contact area on the collector side can be larger, so that the control range of the characteristic of the IGBT can be widened. In this configuration, not limited to the case where contact recesses CH1 on the collector side have two rows and contact recess CH2 on the emitter side has one row, it is all necessary that the number of rows of the line contact structure of contact recesses CH1 on the collector side is larger than the number of rows of the line contact structure of contact recess CH2 on the emitter side. Further, contact recesses CH1 on the collector side may be the two-rows divided line contact structure or two-rows hole contact structure, and contact recess CH2 on the emitter side may be one-row divided line contact structure or one-row hole contact structure.

Third Embodiment

Figure 36:
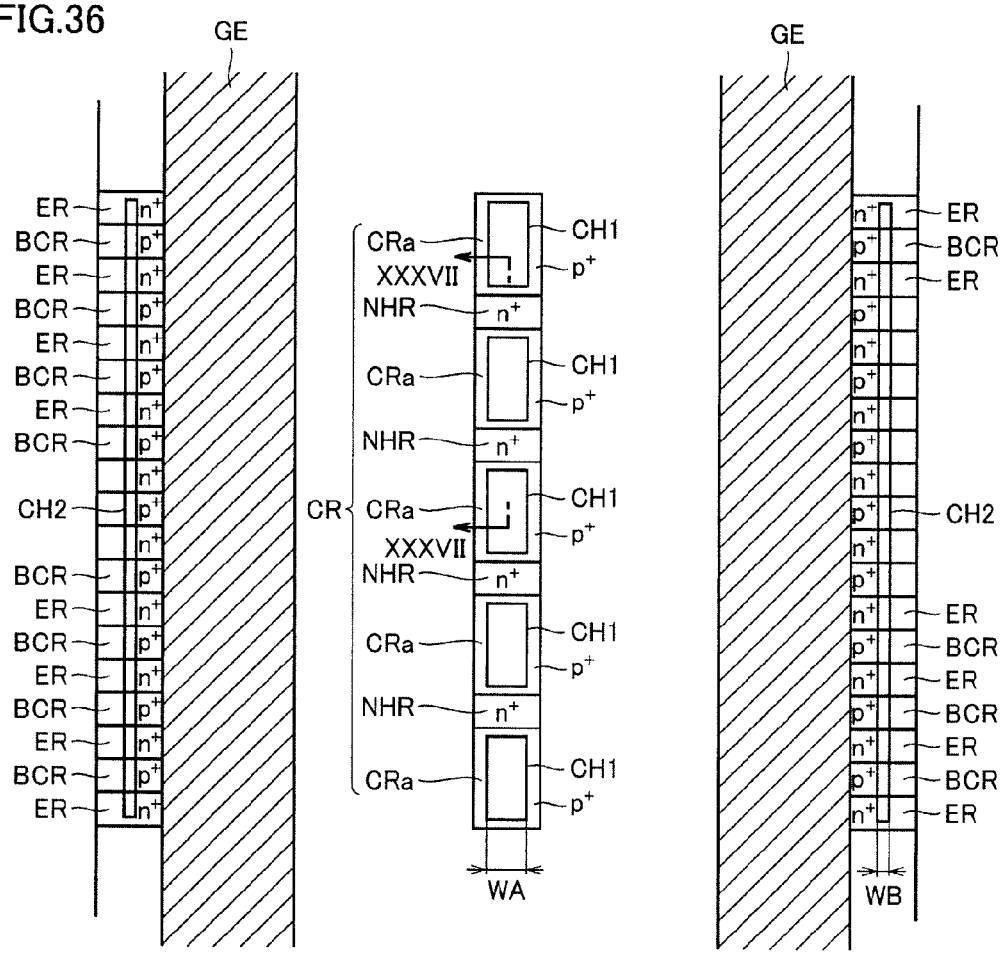
FIG. 36 is a schematic plan view representing a configuration of the IGBT in a semiconductor device in accordance with a third embodiment, where a collector region is partially spaced (segmented) by an $n^+$ region, and a contact on a collector side has a line contact structure with a large line width, and a contact on an emitter side has a line contact structure with a small line width.
Figure 37:
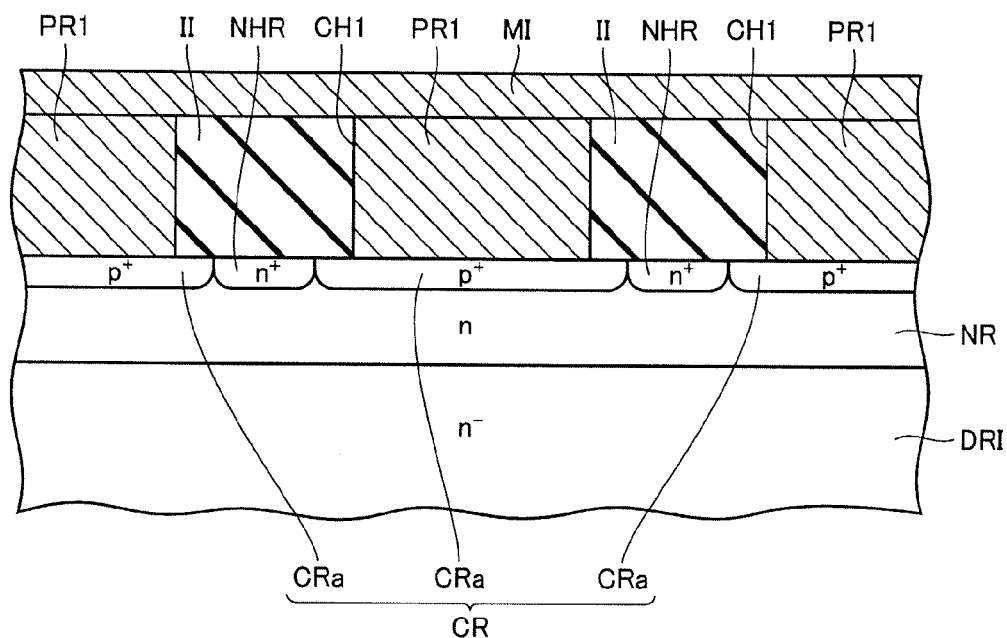
FIG. 37 is a schematic cross-sectional view taken along the line XXXVII-XXXVII of FIG. 36.

Referring to FIGS. 36 and 37, the configuration of the present embodiment is different from the configuration shown in FIG. 4 in that p+ collector region CR is partially spaced (segmented) by n+ separation regions NHR. In other words, in one IGBT, p+ collector region CR is constituted of a plurality of p+ collector region portions CRa separated by a plurality of n+ separation regions NHR. Each of the plurality of n+ separation regions NHR has a higher n-type impurity concentration than n-type region NR.

In the IGBT described above, both contact recesses CH1, CH2 on the collector side and emitter side have a line contact structure. One p+ collector region portion CRa is provided with one line contact portion CH1, and line contact portion CH1 is not provided on n+ separation region NHR sandwiched between p+ collector region portions CRa. Line width WA of the connection portion between plug layer PR1 and p+ collector region CR is preferably larger than line width WB of the connection portion between plug layer PR2 and p+ base contact regions BCR.

The configuration of the present embodiment other than those described above is substantially the same as the configuration shown in FIG. 4. Therefore, the same elements have the same reference numerals allotted, and description thereof will not be repeated.

According to the present embodiment, since p+ collector region CR is partially spaced by the plurality of n+ separation regions NHR, the control range of the characteristic of the IGBT can be widened. Further, since the configuration in which p+ collector region CR is partially spaced by n+ separation regions NHR can be manufactured by only changing an impurity implantation mask for forming p+ collector region CR and n+ separation regions NHR, the configuration described above can be manufactured at low cost.

Further, in the IGBT shown in FIGS. 36 and 37, both contact recesses CH1, CH2 on the collector side and emitter side have a line contact structure. Using the line contact structure as described can set the contact area to be larger than the case where the hole contact structure is used, so that the control range of the characteristic of the IGBT can be widened.

In the IGBT shown in FIGS. 36 and 37, line width WA of the connection portion between plug layer PR1 and p+ collector region CR is preferably larger than line width WB of the connection portion between plug layer PR2 and p+ base contact regions BCR. Accordingly, the control range of the characteristic of the IGBT can be further widened.

Each of the configurations shown in FIGS. 27 to 35 may also be the configuration in which p+ collector region CR is partially spaced by the plurality of n+ separation regions NHR.

Fourth Embodiment

Figure 38:
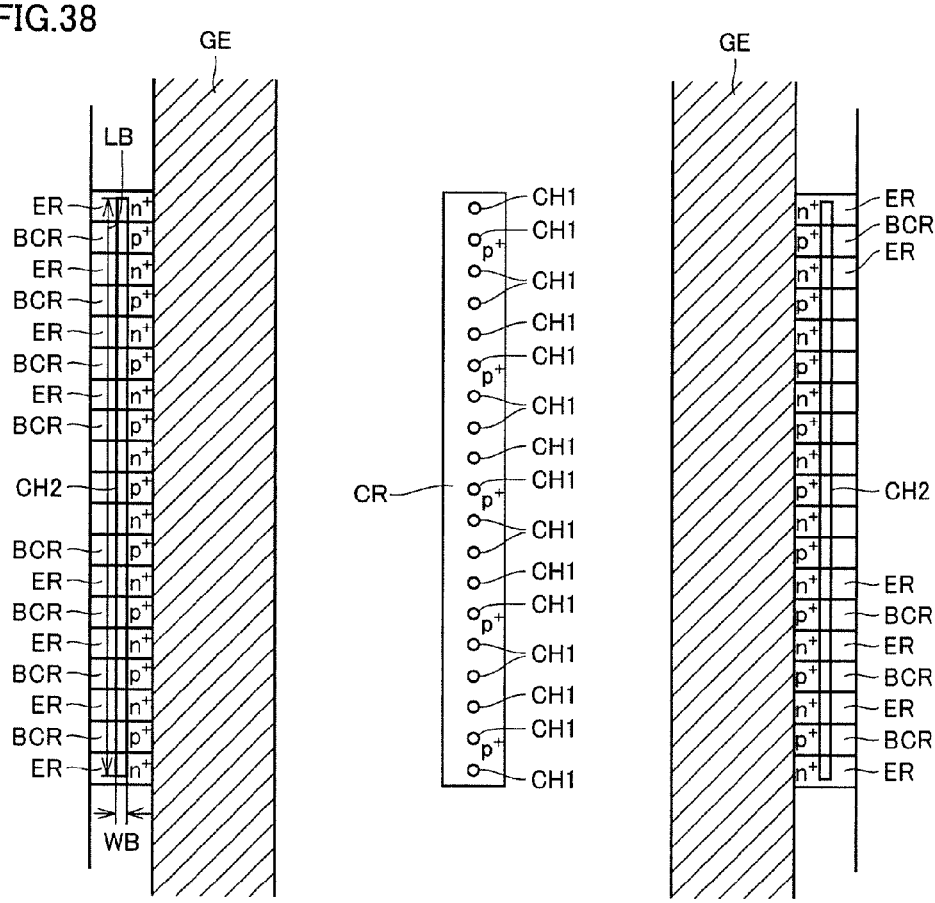
FIG. 38 is a plan view schematically representing a configuration of the IGBT included in a semiconductor device in accordance with a fourth embodiment.

Referring to FIG. 38, the IGBT included in the semiconductor device of the present embodiment is, for example, a current-prioritized element such as IGBT on Low Side. The configuration of the IGBT of the present embodiment is different from the configuration shown in FIG. 4 in that the ratio (contact area on p+ region/p+ region area: SB11/SA11) is larger than the ratio (collector contact area/collector active area: SB12/SA12).

In other words, the ratio (contact area on p+ region/p+ region area: SB11/SA11) of the area of the connection portion between p+ base contact regions BCR and plug layer PR2 (contact area on region: SB11) to the area of p+ base contact regions BCR on the main surface of semiconductor substrate SUB (p+ region area: SA11) in the current-prioritized IGBT is larger than the ratio (collector contact area/collector active area: SB12/SA12) of the area of the connection portion between p+ collector region CR and plug layer PR1 (collector contact area: SB12) to the area of p+ collector region CR on the main surface of semiconductor substrate SUB (collector active area: SA12) in the same IGBT.

Here, the collector connection portion between p+ collector region CR and plug layer PR1 (connection portion in contact recesses CH1) in the current-prioritized IGBT has a hole contact structure. Further, the emitter connection portion between p+ base contact regions BCR and plug layer PR2 in the same IGBT (the connection portion in contact recess CH2) has a line contact structure.

Further, one p+ collector region CR is connected to plug layer PR1 within a plurality of contact recesses CH1 segmented from one another. Further, the number of contact recesses CH1 provided on one p+ collector region CR (the number of contacts) is preferably larger than the number of contact recesses CH2 provided on one p+ base contact region (base active region) BCR. In the present embodiment, the number of contact recesses CH1 provided on one p+ collector region CR is, for example, nineteen, and the number of contact recess CH2 provided on one p+ base contact region BCR is one, but not limited to these numbers.

The configuration of the present embodiment other than those described above is substantially the same as the configuration shown in FIG. 4. Therefore, the same elements have the same reference numerals allotted, and description thereof will not be repeated.

Next, the effect of the present embodiment will be described.

As described above, in the present embodiment, the ratio (contact area on $p^+$ region/$p^+$ region area: SB11/SA11) is larger than the ratio (collector contact area/collector active area: SB12/SA12). Therefore, as shown in FIGS. 7 and 8, the linear current and saturation current can be improved in the current-prioritized IGBT on Low Side. In other words, without performing large-scaled changes, such as a change in an element size, a change in an implantation layout, and a change in an impurity implantation condition, and optimization, improvements in characteristics such as current improvement and on-state breakdown voltage improvement of a lateral IGBT can be performed while suppressing the burden on development with a small-scaled change such as a change in a contact size.

Since the change in the contact size can be controlled with only the change in the contact mask, readjustment after an experimental manufacture of the contact can be performed at low cost.

Further, in the present embodiment, since one $p^+$ collector region CR is provided with a plurality of contact recesses CH1, the current route can be distributed, and the implantation of the minority carrier can be distributed. In the following, this issue will be described with reference to FIGS. 39 to 42.

Figure 39:
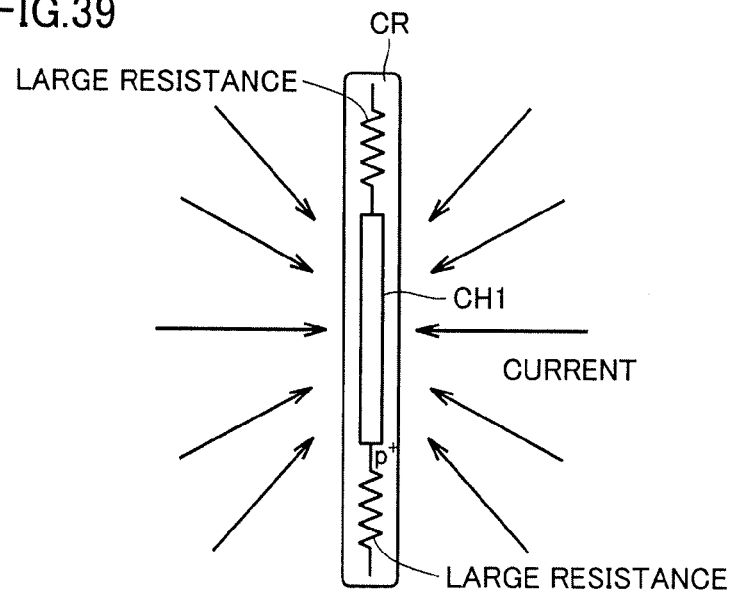
FIG. 39 is a plan view illustrating that current is concentrated in a current route on a collector side of a related art as a comparative example.
Figure 40:
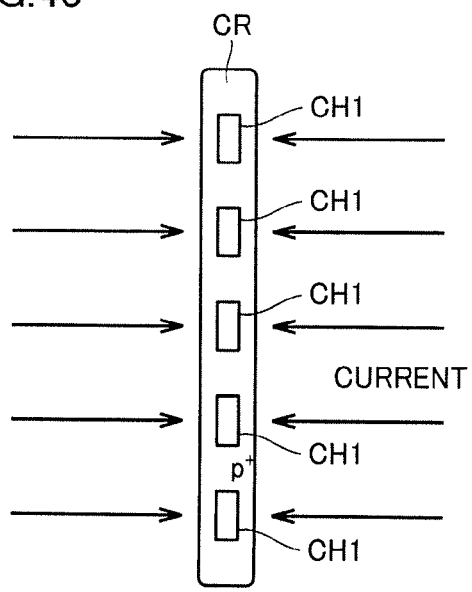
FIG. 40 is a plan view illustrating that a current path is distributed in a current route on a collector side of the semiconductor device in accordance with the fourth embodiment.

Referring to FIG. 39, when one $p^+$ collector region CR is provided with one contact recess CH1, current is concentrated on one contact recess CH1. On the contrary, when one $p^+$ collector region CR is provided with a plurality of contact recesses CH1 as shown in FIG. 40, the current route is distributed to each of the plurality of contact recesses CH1. Therefore, the current can flow efficiently.

Figure 41:
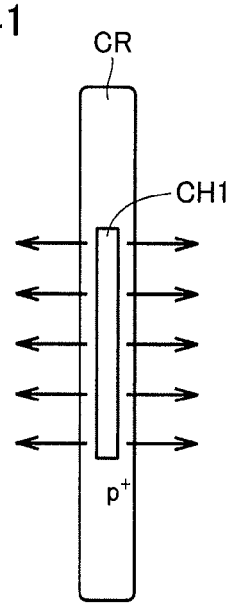
FIG. 41 is a plan view illustrating that, during implantation of a minority carrier (hole) on a collector side of a related art as a comparative example, a region to which a minority carrier is implanted is local.
Figure 42:
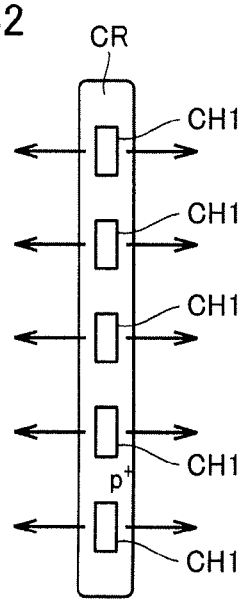
FIG. 42 is a plan view illustrating that, during implantation of the minority carrier (hole) on a collector side of the semiconductor device in accordance with the fourth embodiment, implantation of the minority carrier is distributed.

Further, referring to FIG. 41, when one $p^+$ collector region CR is provided with one contact recess CH1, the region to which the minority carrier is implanted becomes one and local, so that concentration of the current occurs. On the other hand, when one $p^+$ collector region CR is provided with a plurality of contact recesses CH1 as shown in FIG. 42, the minority carrier is implanted from each of the plurality of contact recesses CH1. Therefore, the implantation of the minority carrier is distributed and equalized.

Figure 43:
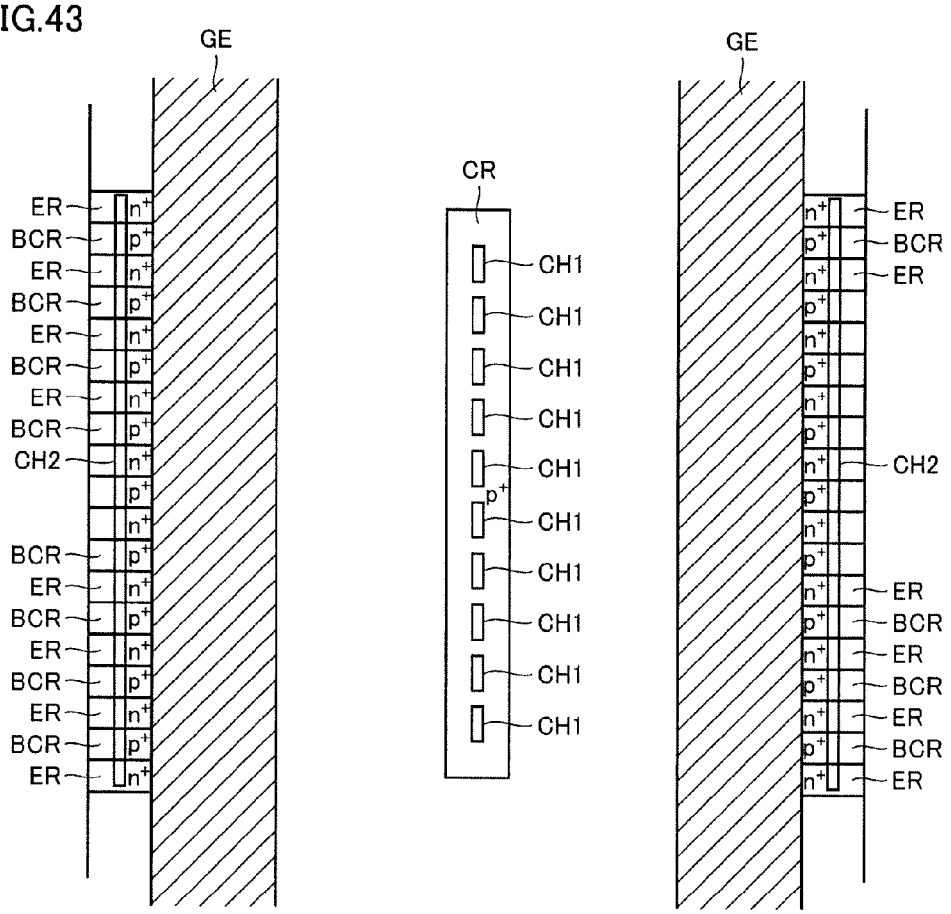
FIG. 43 is a schematic plan view representing a configuration of the IGBT in the semiconductor device in accordance with the fourth embodiment, where a contact on a collector side has a divided line contact structure, and a contact on an emitter side has a line contact structure.

In the IGBT described above, contact recesses CH1 on the collector side have a hole contact structure, and contact recess CH2 on the emitter side have a line contact structure. However, as shown in FIG. 43, contact recesses CH1 on the collector side may have the divided line contact structure, and contact recess CH2 on the emitter side may have the line contact structure. Also in this case, since contact recesses CH1 on the collector side have a divided line contact structure, the contact area can be smaller than the case where the line contact structure is used, so that the control range of the characteristic of the IGBT can be widened.

Figure 44:
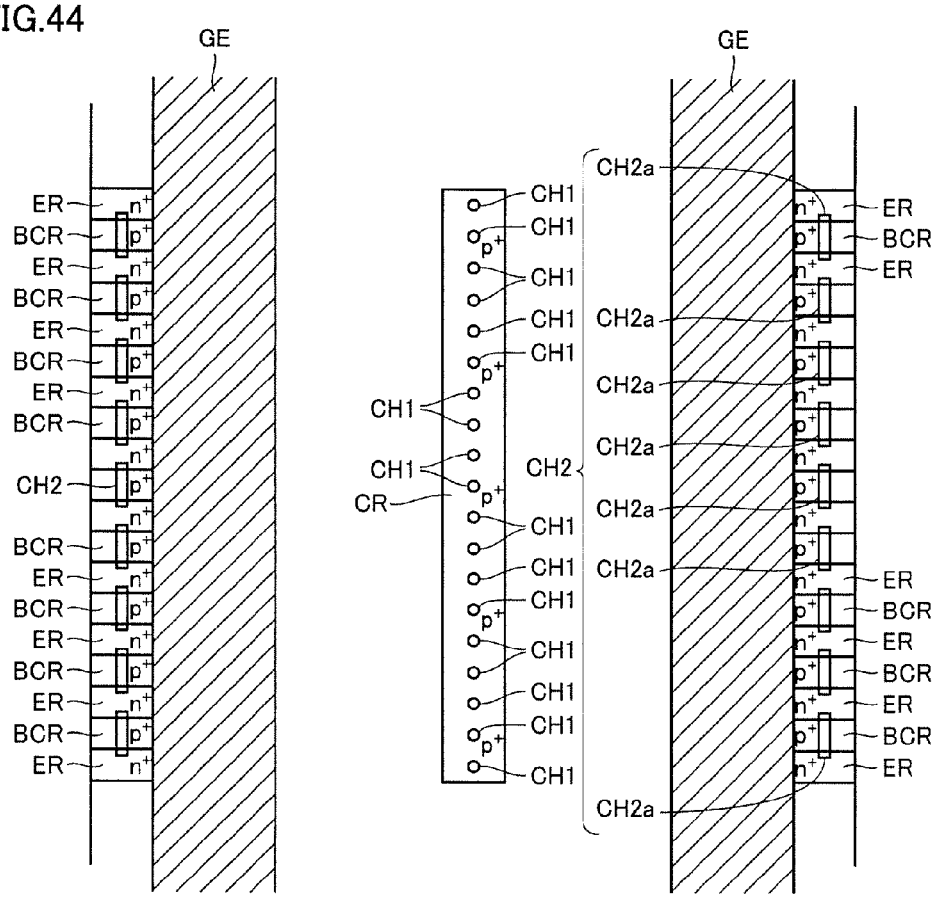
FIG. 44 is a schematic plan view representing a configuration of the IGBT in the semiconductor device in accordance with the fourth embodiment, where a contact on a collector side has a hole contact structure and a contact on an emitter side has a divided line contact structure.

Further, in the IGBT of the present embodiment, as shown in FIG. 44, contact recesses all on the collector side may have a hole contact structure, and contact recesses CH2 on the emitter side may have a divided line contact structure. In other words, contact recesses CH2 on the emitter side have a divided line contact structure having a plurality of line contact portions CH2a separated from one another and arranged in series. Also in this case, since contact recesses CH1 on the collector side have the hole contact structure, the contact area can be smaller than the case where the line contact structure is used, so that the control range of the characteristic of the IGBT can be widened.

Figure 45:
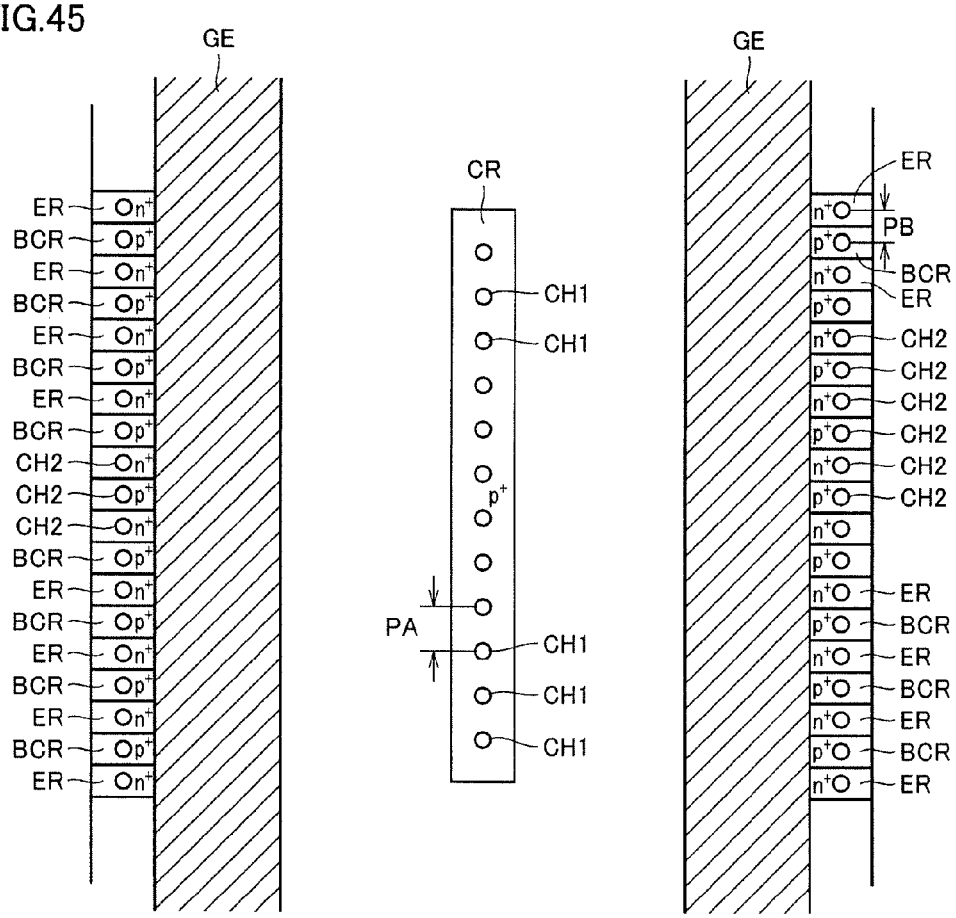
FIG. 45 is a schematic plan view representing a configuration of the IGBT in the semiconductor device in accordance with the fourth embodiment, where a contact on a collector side has a hole contact structure with a large contact hole pitch, and a contact on an emitter side has a hole contact structure with a small hole pitch.

Further, in the IGBT of the present embodiment, as shown in FIG. 45, both contact recesses CH1, CH2 on the collector side and emitter side may have the hole contact structure. In this case, hole pitch PA of contact recesses CH1 on the collector side is preferably larger than hole pitch PB of contact recesses CH2 on the emitter side. Also in this case, since hole pitch PA of contact recesses CH1 on the collector side is large, the contact area can be smaller than the case where the hole pitch is small, so that the control range of the characteristic of the IGBT can be widened. In this configuration, an area of one contact recess CH1 on the collector side is preferably equal to an area of one contact recess CH2 on the emitter side.

Figure 46:
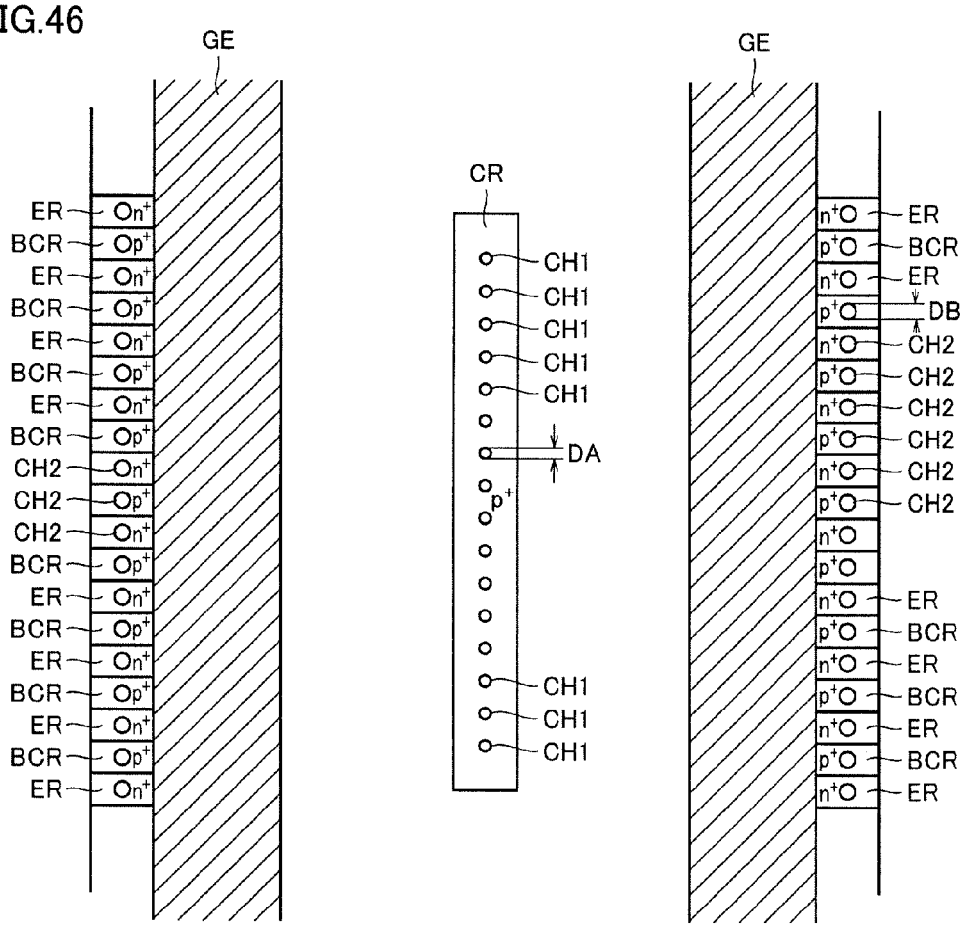
FIG. 46 is a schematic plan view representing a configuration of the IGBT in the semiconductor device in accordance with the fourth embodiment, where a contact on a collector side has a hole contact structure with a small hole diameter, and a contact on an emitter side has a hole contact structure with a large hole diameter.

Further, in the IGBT of the present embodiment, as shown in FIG. 46, both contact recesses CH1, CH2 on the collector side and emitter side may have a hole contact structure. In this case, diameter DA of the holes of contact recesses CH1 on the collector side is preferably smaller than diameter DB of the holes of contact recesses CH2 on the emitter side. Also in this case, since diameter DA of the holes of contact recesses CH1 on the collector side is small, the contact area can be smaller than the case where the diameter of the holes is large, so that the control range of the characteristic of the IGBT can be widened. In this configuration, the hole pitch of contact recesses CH1 on the collector side is preferably equal to the hole pitch of contact recesses CH2 on the emitter side.

Figure 47:
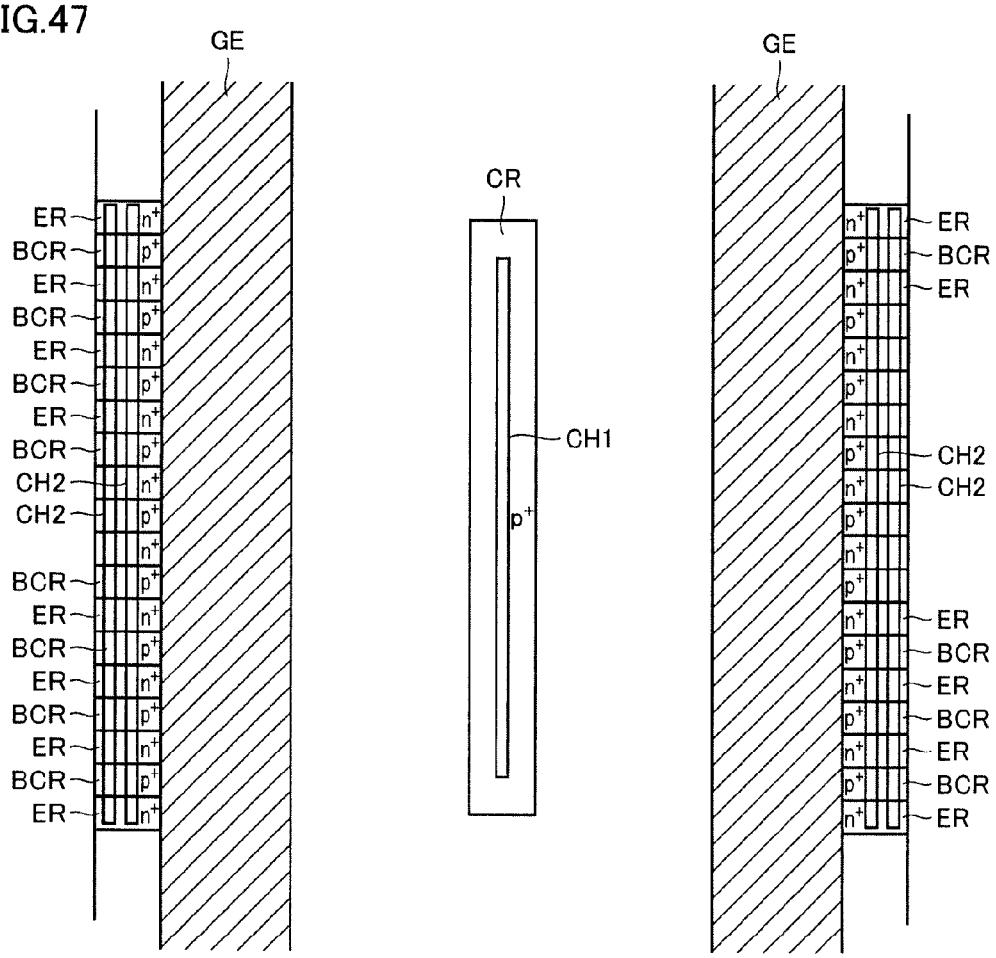
FIG. 47 is a schematic plan view representing a configuration of the IGBT in the case where a contact on a collector side has a one-row line contact structure, and a contact on an emitter side has a two-rows line contact structure.

Further, in the IGBT of the present embodiment, as shown in FIG. 47, contact recess CH1 on the collector side may have a one-row line contact structure, and contact recesses CH2 on the emitter side may have a two-rows line contact structure. Also in this case, since the number of rows of contact recesses CH2 on the emitter side is larger than the number of rows of contact recess CH1 on the collector side, the contact area on the emitter side can be larger, so that the control range of the characteristic of the IGBT can be widened. In this configuration, not limited to the case where contact recess CH1 on the collector side has one row, and contact recesses CH2 on the emitter side have two rows, it is all necessary that the number of rows of the line contact structure of contact recesses CH2 on the emitter side is larger than the number of rows of the line contact structure of contact recess CH1 on the collector side. Further, contact recess CH1 on the collector side may be one-row divided line contact structure or one-row hole contact structure, and contact recesses CH2 on the emitter side may be two-rows divided line contact structure or two-rows hole contact structure.

Fifth Embodiment

Figure 48:
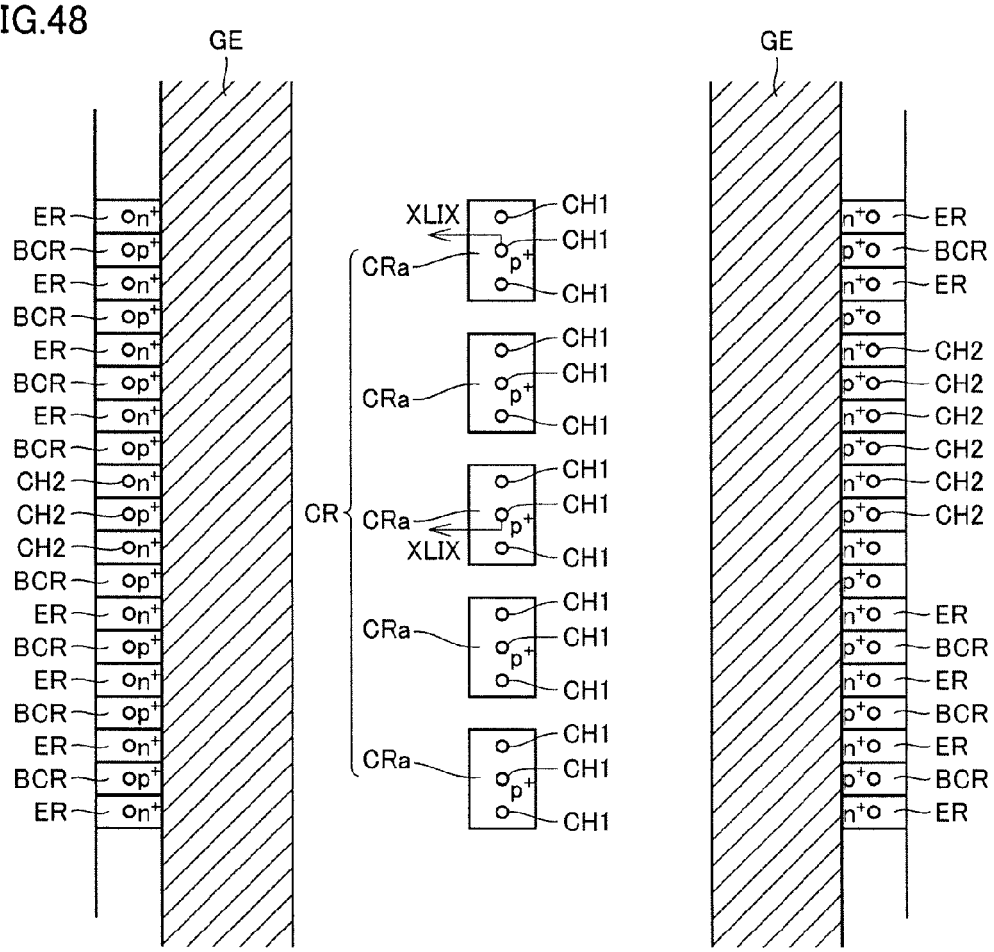
FIG. 48 is a plan view schematically representing a configuration of the IGBT included in a semiconductor device in accordance with a fifth embodiment.
Figure 49:
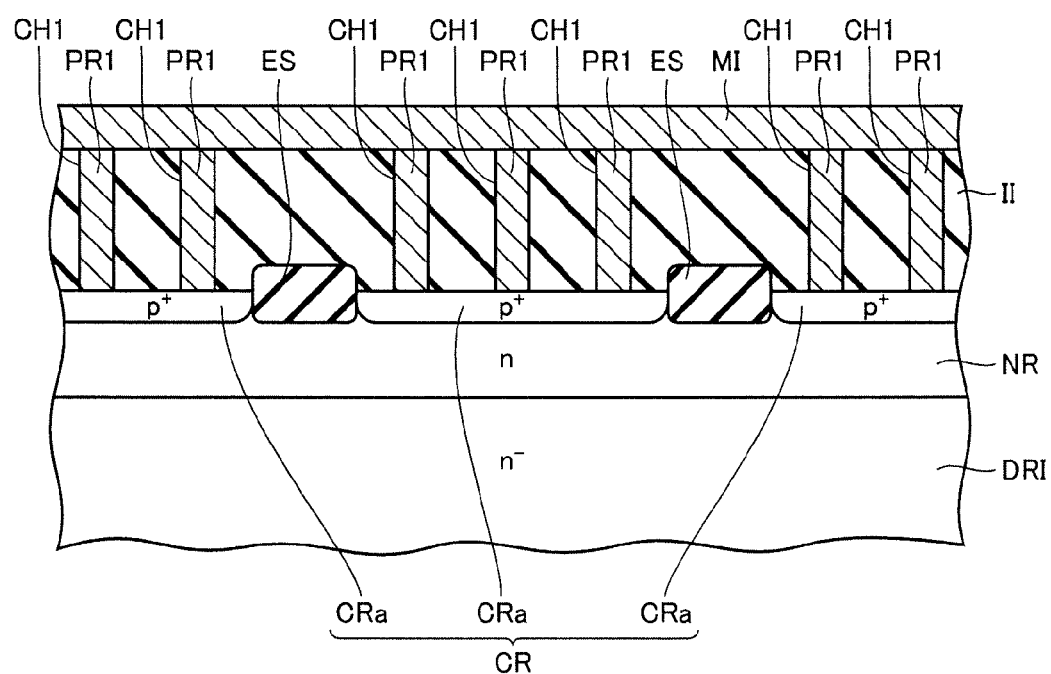
FIG. 49 is a schematic cross-sectional view taken along the line XLIX-XLIX of FIG. 48.
Figure 56:
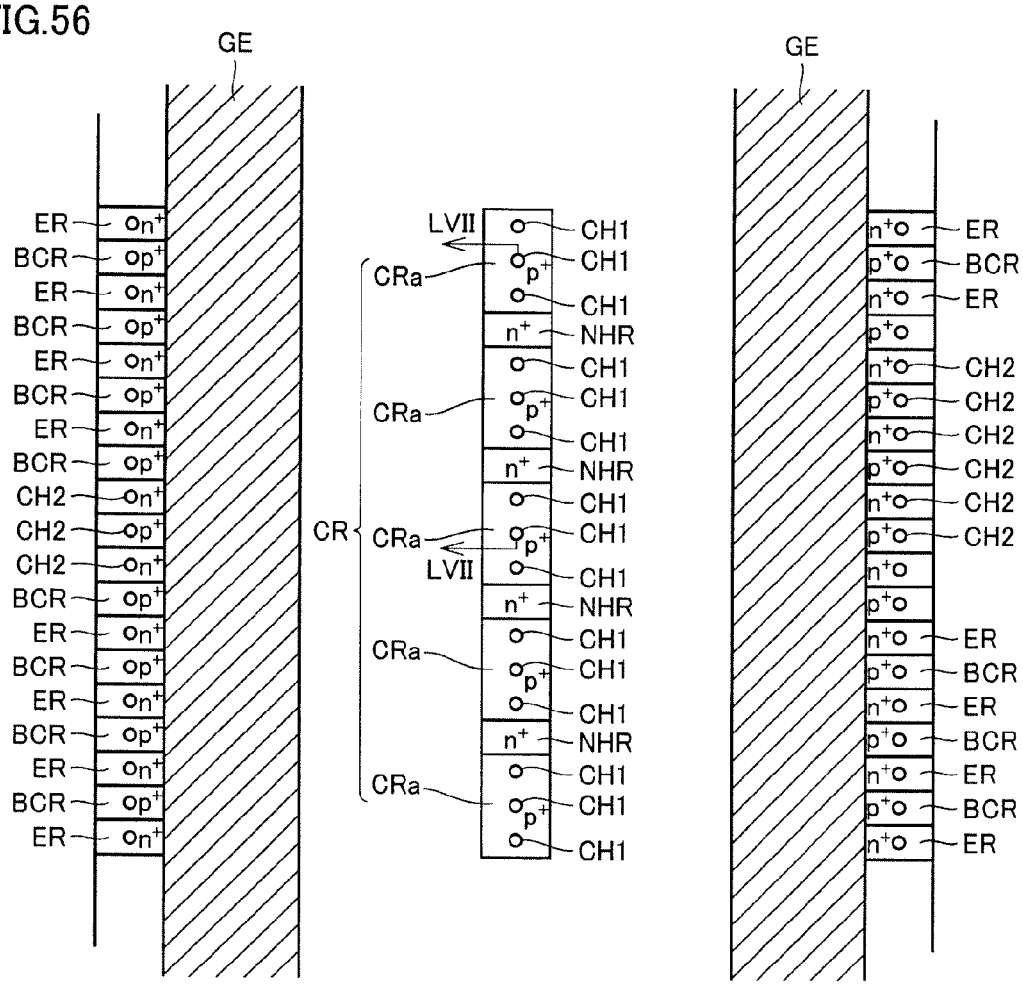
FIG. 56 is a schematic plan view representing a configuration of the IGBT in which the collector region is partially spaced (segmented) by an $n^+$ region.
Figure 57:
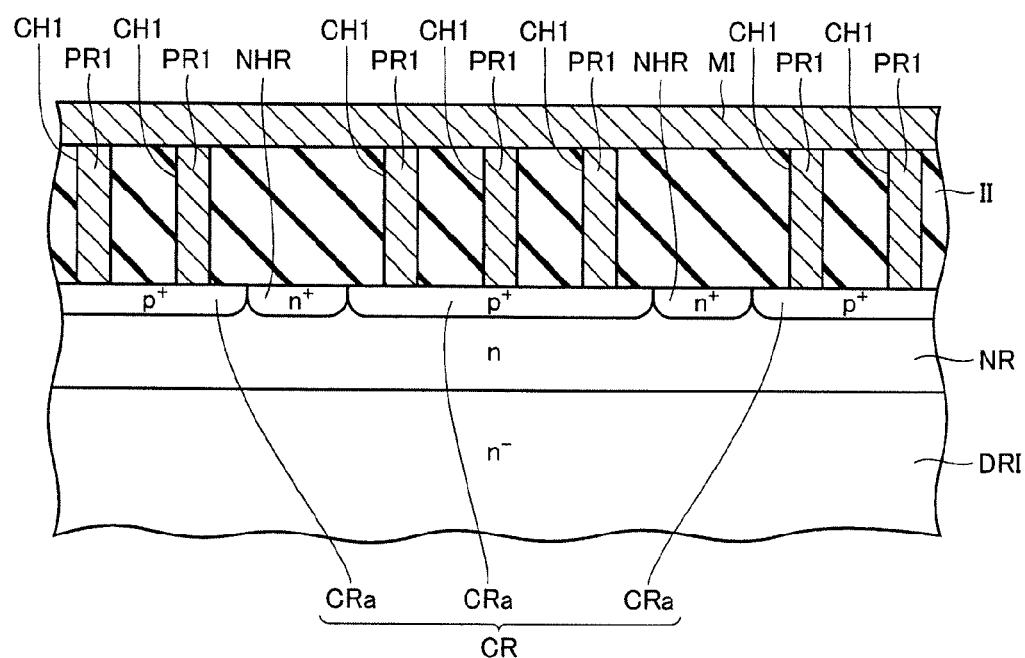
FIG. 57 is a schematic cross-sectional view taken along the LVII-LVII line of FIG. 56.

Referring to FIGS. 48 and 49, the configuration of the present embodiment is different from the configuration shown in FIG. 38 in that $p^+$ collector region CR is partially spaced (segmented) by element separation structure ES. In other words, in one IGBT, $p^+$ collector region CR is constituted of a plurality of $p^+$ collector region portions CRa (collector active regions) separated from one another. $P^+$ collector region CR may be partially spaced by element separation structure ES as shown in FIGS. 48 and 49, or may be partially spaced by a plurality of $n^+$ separation regions NHR as shown in FIGS. 56 and 57. Further, as described in the first embodiment, element separation structure ES may be a silicon oxide film formed of LOCOS, or may be STI.

Further, one $p^+$ collector region portion CRa is connected to plug layer PR1 within the plurality of contact recesses CH1 segmented from one another. Further, the number of contact recesses CH1 (the number of contacts) provided on one p$^+$ collector region portion CRa is preferably larger than the number of contact recesses CH2 (the number of contacts) provided on one p$^+$ base contact region (base active region) BCR. In the present embodiment, the number of contact recesses all provided on one p$^+$ collector region portion CRa is, for example, three, and the number of contact recesses CH2 provided on one p$^+$ base contact region BCR is, for example, one, but not limited to these numbers.

Further, in the IGBT described above, both contact recesses CH1, CH2 on the collector side and emitter side have a hole contact structure.

The configuration of the present embodiment other than those described above is substantially the same as the configuration shown in FIG. 38. Therefore, the same elements have the same reference numerals allotted, and description thereof will not be repeated.

According to the present embodiment, since p$^+$ collector region CR is partially spaced by element separation structure ES, the current can be improved. Further, since the configuration in which p$^+$ collector region CR is partially spaced by element separation structure ES can be manufactured by only changing the field mask, the configuration described above can be manufactured at low cost.

Further, in the present embodiment, since one p$^+$ collector region portion CRa is provided with a plurality of contact recesses CH1, the current route can be distributed and the implantation of the minority carrier can be distributed as described in FIGS. 39 to 42.

Figure 50:
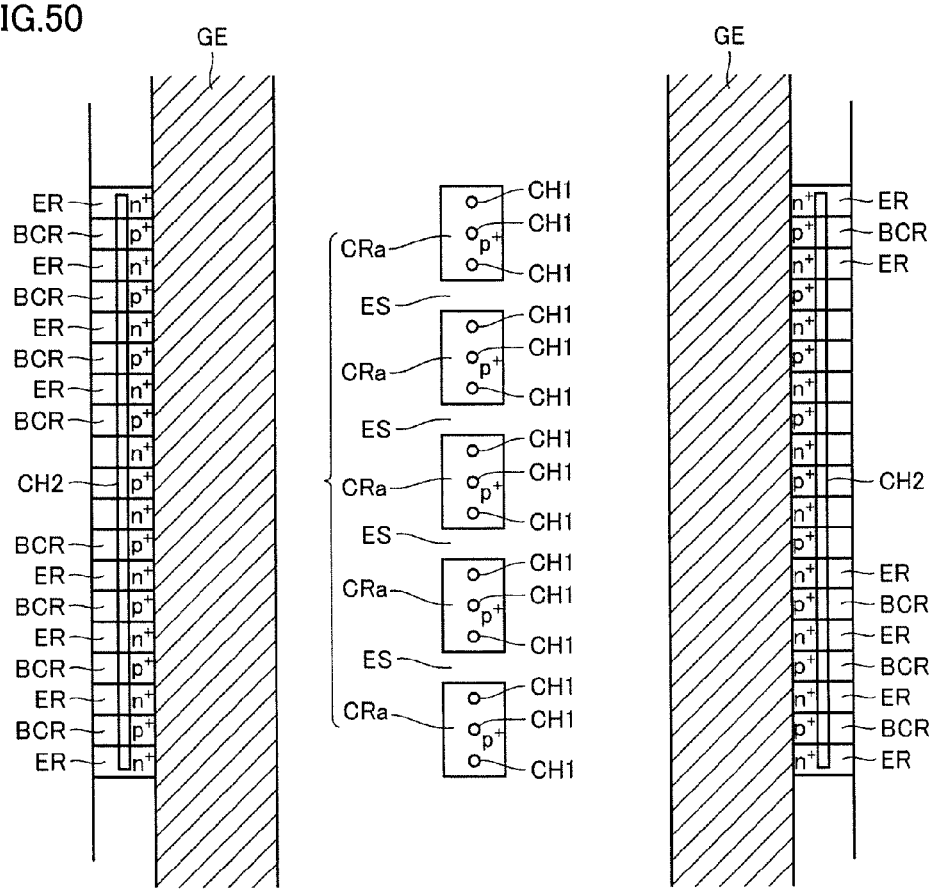
FIG. 50 is a schematic plan view representing a configuration of the IGBT in the case where a collector region is partially spaced (segmented) by an element separation structure, and a contact on a collector side has a hole contact structure, and a contact on an emitter side has a line contact structure.

In the IGBT described above, both contact recesses CH1, CH2 on the collector side and emitter side have a hole contact structure. However, as shown in FIG. 50, contact recesses CH1 on the collector side may have a hole contact structure, and contact recess CH2 on the emitter side may have a line contact structure. Also in this case, since contact recesses CH1 on the collector side have the hole contact structure, the contact area can be smaller than the case where the line contact structure is used, so that the control range of the characteristic of the IGBT can be widened.

Figure 51:
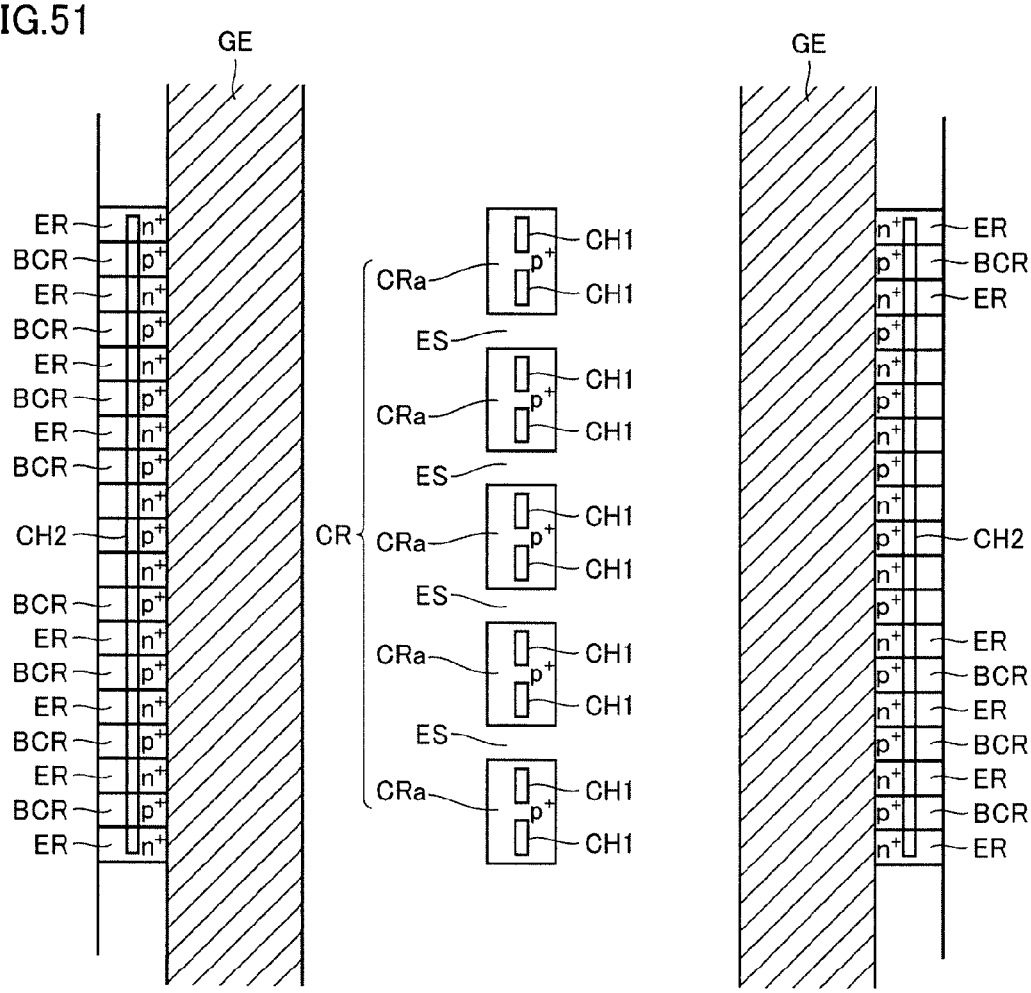
FIG. 51 is a schematic plan view representing a configuration of the IGBT in the case where the collector region is partially spaced (segmented) by an element separation structure, and a contact on a collector side has a divided line contact structure, and a contact on an emitter side has a line contact structure.

Further, in the IGBT of the present embodiment, as shown in FIG. 51, contact recesses CH1 on the collector side may have a divided line contact structure, and contact recess CH2 on the emitter side may have a line contact structure. Also in this case, since contact recesses CH1 on the collector side have the divided line contact structure, the contact area can be smaller than the case where the line contact structure is used, so that the control range of the characteristic of the IGBT can be widened.

Figure 52:
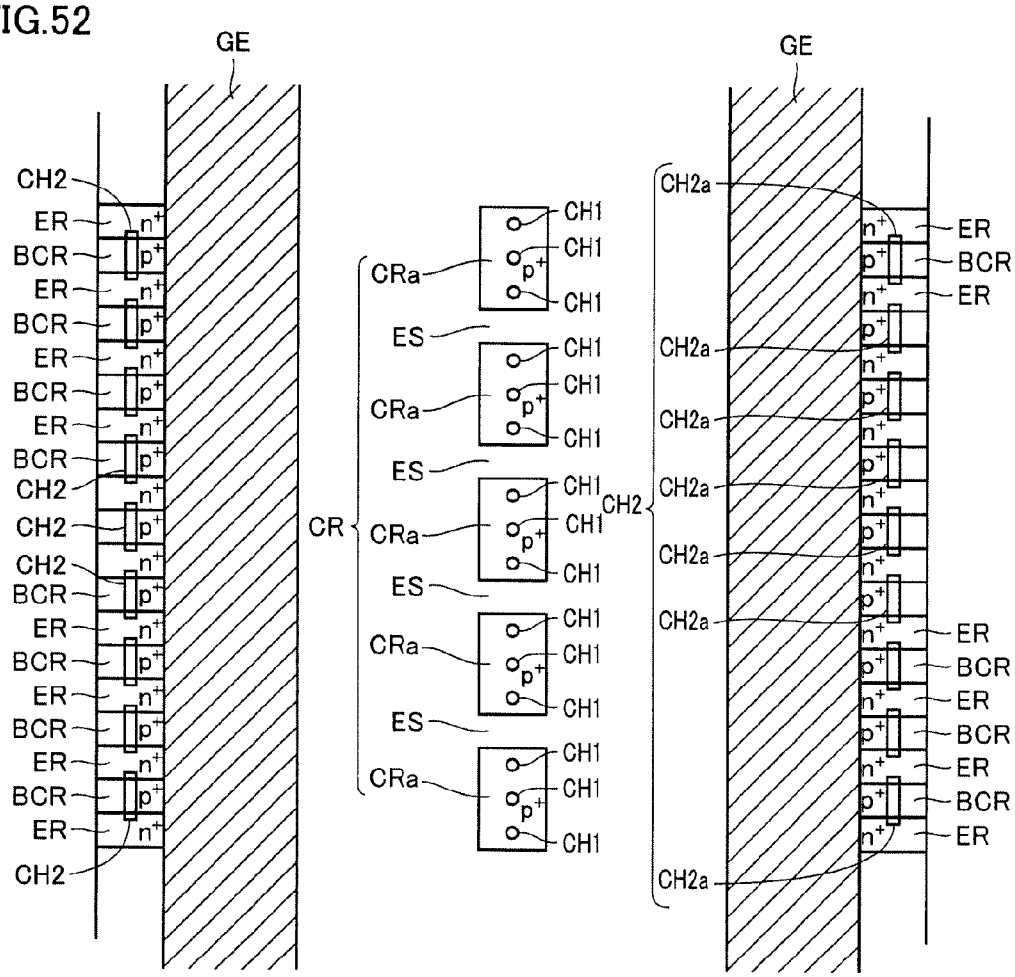
FIG. 52 is a schematic plan view representing a configuration of the IGBT in the case where the collector region is partially spaced (segmented) by the element separation structure, and a contact on a collector side has a hole contact structure, and a contact on an emitter side has a divided line contact structure.

Further, in the IGBT of the present embodiment, as shown in FIG. 52, contact recesses CH1 on the collector side may have a hole contact structure, and contact recesses CH2 on the emitter side may have a divided line contact structure. In other words, contact recesses CH2 on the emitter side has the divided line contact structure having a plurality of line contact portions CH2$a$ separated from one another and arranged in series. Also in this case, since contact recesses CH1 on the collector side have the hole contact structure, the contact area can be smaller than the case where the line contact structure is used, so that the control range of the characteristic of the IGBT can be widened.

Figure 53:
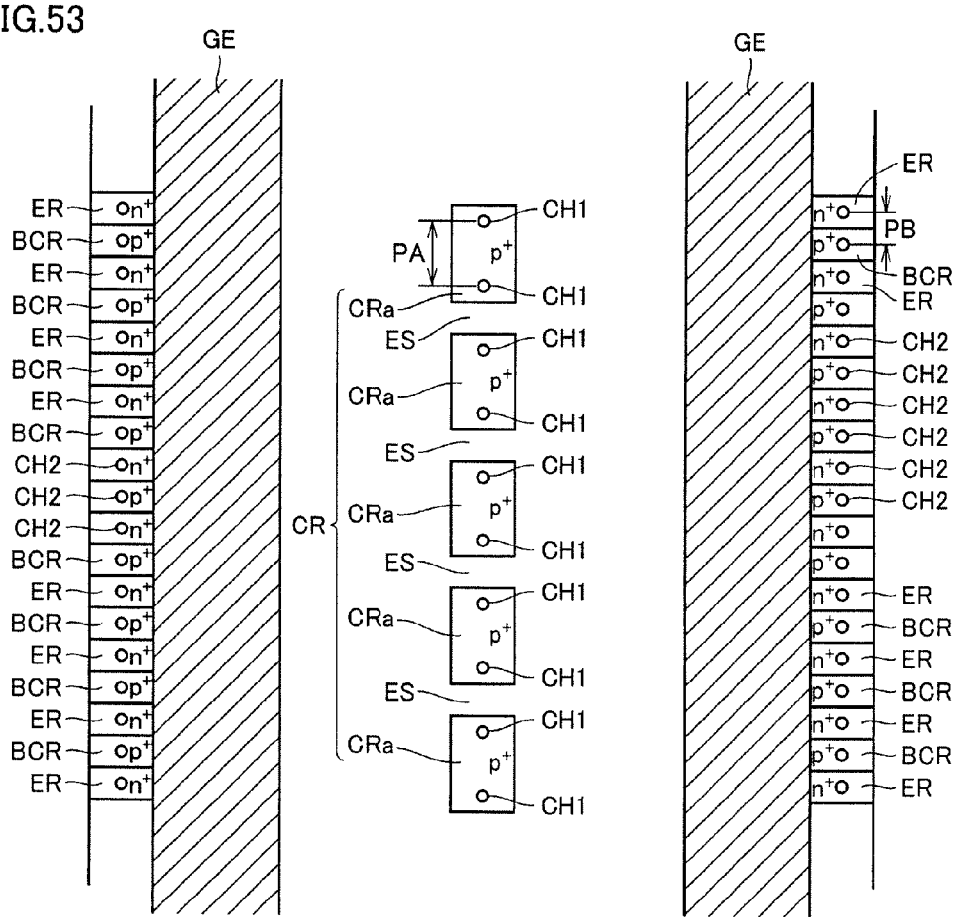
FIG. 53 is a schematic plan view representing a configuration of the IGBT in the case where the collector region is partially spaced (segmented) by the element separation structure, and a contact on a collector side has a hole contact structure with a large hole pitch, and a contact on an emitter side has a hole contact structure with a small hole pitch.

Further, in the IGBT of the present embodiment, as shown in FIG. 53, both contact recesses CH1, CH2 on the collector side and emitter side may have the hole contact structure. In this case, hole pitch PA of contact recesses CH1 on the collector side is preferably larger than hole pitch PB of contact recesses CH2 on the emitter side. Also in this case, since hole pitch PA of contact recesses CH1 on the collector side is large, the contact area can be smaller than the case where the hole pitch is small, so that the control range of the characteristic of the IGBT can be widened. In this configuration, an area of one contact recess CH1 on the collector side is preferably equal to an area of one contact recess CH2 on the emitter side.

Figure 54:
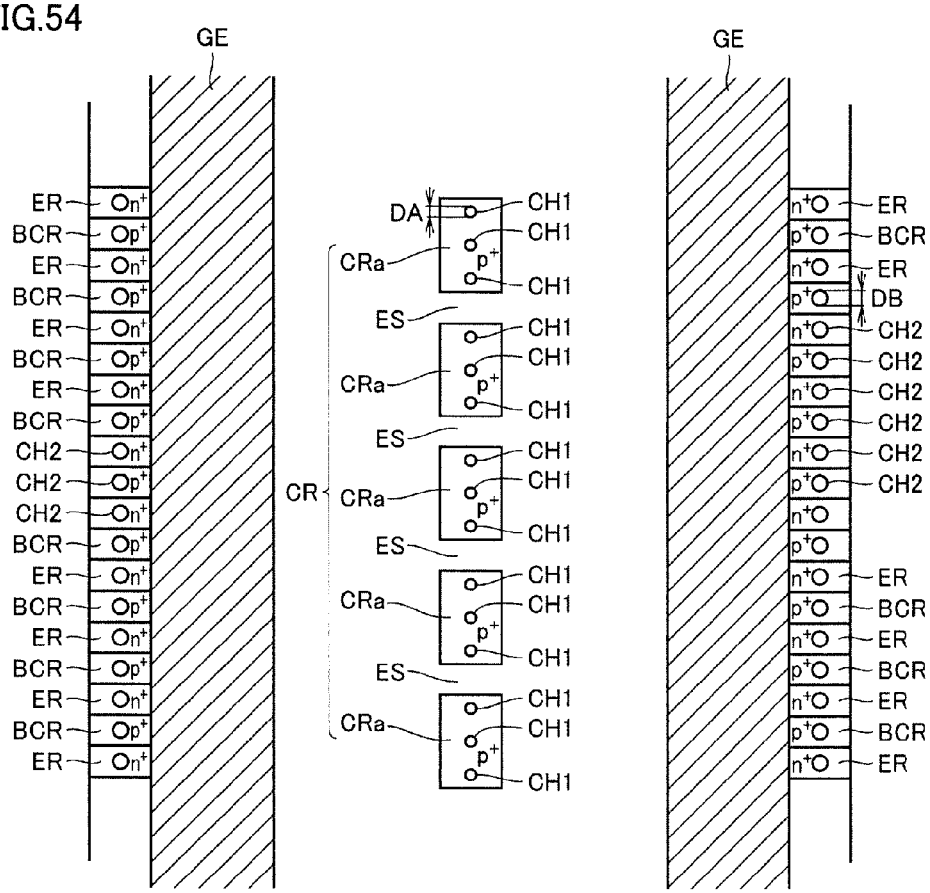
FIG. 54 is a schematic plan view representing a configuration of the IGBT in the case where the collector region is partially spaced (segmented) by the element separation structure, and a contact on a collector side has a hole contact structure with a small hole diameter, and a contact on an emitter side has a hole contact structure with a large hole diameter.

Further, in the IGBT of the present embodiment, as shown in FIG. 54, both contact recesses CH1, CH2 on the collector side and emitter side may have the hole contact structure. In this case, diameter DA of the holes of contact recesses CH1 on the collector side is preferably smaller than diameter DB of the holes of contact recesses CH2 on the emitter side. Also in this case, since diameter DA of the holes of contact recesses CH1 on the collector side is small, the contact area can be smaller than the case where the diameter of the holes is large, so that the control range of the characteristic of the IGBT can be widened. In this configuration, the hole pitch of contact recesses CH1 on the collector side is preferably equal to the hole pitch of contact recesses CH2 on the emitter side.

Figure 55:
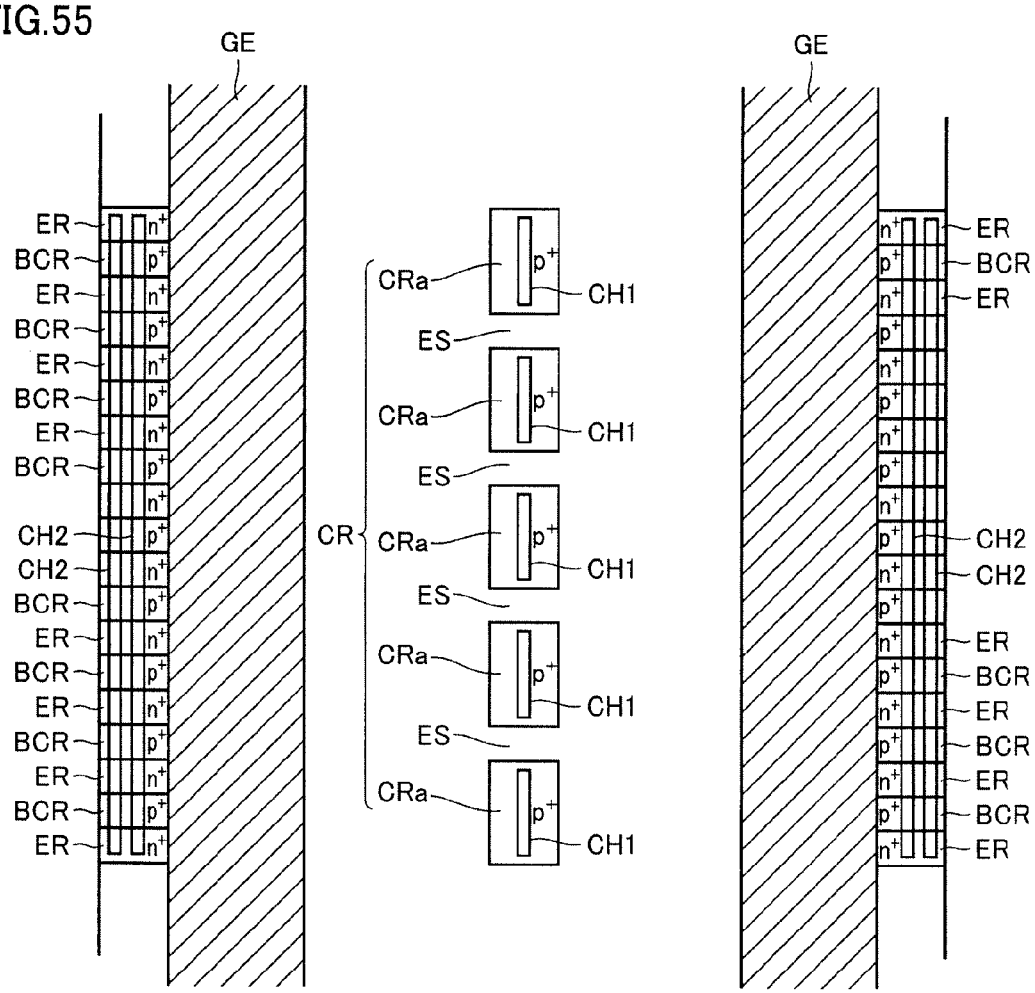
FIG. 55 is a schematic plan view representing a configuration of the IGBT in the case where the collector region is partially spaced (segmented) by the element separation structure, and a contact on a collector side has a one-row line contact structure, and a contact on an emitter side has a two-rows line contact structure.

Further, in the IGBT of the present embodiment, as shown in FIG. 55, contact recesses CH1 on the collector side may have a one-row line contact structure, and contact recesses CH2 on the emitter side may have a two-rows line contact structure. Also in this case, since the number of rows of contact recesses CH2 on the emitter side is larger than the number of rows of contact recesses CH1 on the collector side, the contact area on the emitter side can be larger, so that the control range of the characteristic of the IGBT can be widened. In this configuration, not limited to the case where contact recesses CH1 on the collector side have one row and contact recesses CH2 on the emitter side have two rows, it is all necessary that the number of rows of the line contact structure of contact recesses CH2 on the emitter side is larger than the number of rows of the line contact structure of contact recesses CH1 on the collector side. Further, contact recesses CH1 on the collector side may be one-row divided line contact structure or one-row hole contact structure, and contact recesses CH2 on the emitter side may be two-rows divided line contact structure or two-rows hole contact structure.

Further, in the configurations of FIGS. 50 to 55, the configuration in which p$^+$ collector region CR is partially spaced by element separation structure ES is described. However, the configurations of FIGS. 50 to 55 may also be partially spaced by the plurality of n$^+$ separation regions NHR as shown in FIGS. 56 and 57.

Sixth Embodiment

Figure 58:
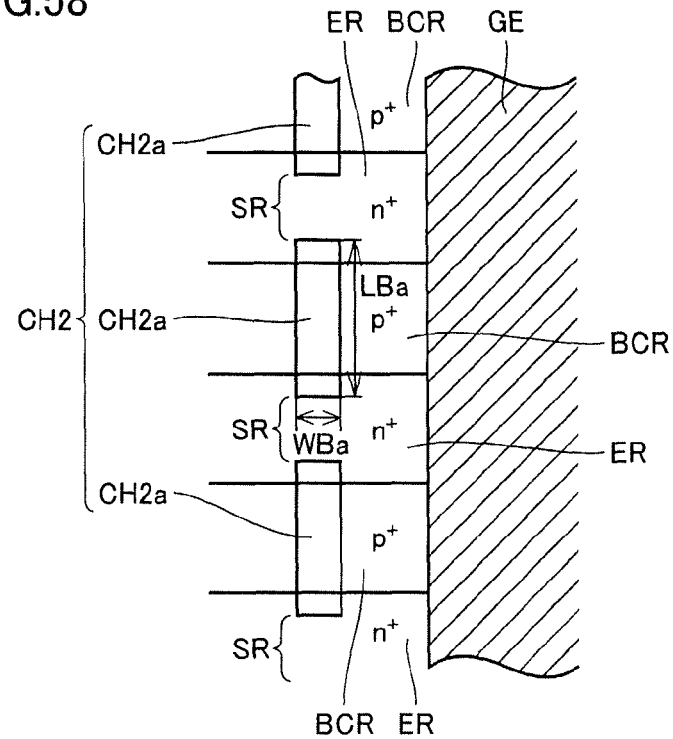
FIG. 58 is a plan view schematically representing a first example of a configuration in which a line contact on an emitter side is divided.

Referring to FIG. 58, the configuration of the present embodiment, similarly to the configurations shown in FIGS. 20, 28, 44, and 52, has the divided line contact structure in which contact recess CH2 on the emitter side has a plurality of line contact portions CH2$a$ separated from one another and arranged in series. Each of the plurality of line contact portions CH2$a$ has the line contact structure. In other words, each of the plurality of line contact portions CH2$a$ has an approximately rectangular shape in a planar view shown in FIG. 58, and has a structure in which a length LBa on one side in the planar view is longer than or equal to twice a length WBa of the other side. In the region directly below separation portion SR located between line contact portions CH2$a$ adjacent to each other in the planar view, only the n-type region (n$^+$ emitter region ER) is located.

The configuration of the present embodiment other than those described above is substantially the same as the configurations shown in FIGS. 20, 28, 44, and 52. Therefore, the same elements have the same reference numerals allotted, and description thereof will not be repeated.

In the present embodiment, contact recess CH2 on the emitter side is divided into a plurality of line contact portions CH2a. Here, in the case of a long line contact structure, a difference in the line widths between the end portion and the central portion in the longitudinal direction of the line contact structure becomes large due to contraction of a photoresist and the like. However, in the present embodiment, the dimension in the longitudinal direction of each of divided line contact portions CH2a is shorter than a length of contact recess CH2 in the longitudinal direction. Therefore, stability of the finished size of contact recess CH2 can be enhanced.

Further, in the present embodiment, only the n-type region ($n^+$ emitter region ER) may be located in the region directly below separation portion SR located between adjacent line contact portions CH2a. Therefore, unevenness in the on-state breakdown voltage due to positional and dimensional deviation of contact recesses CH2 can be suppressed.

Figure 59:
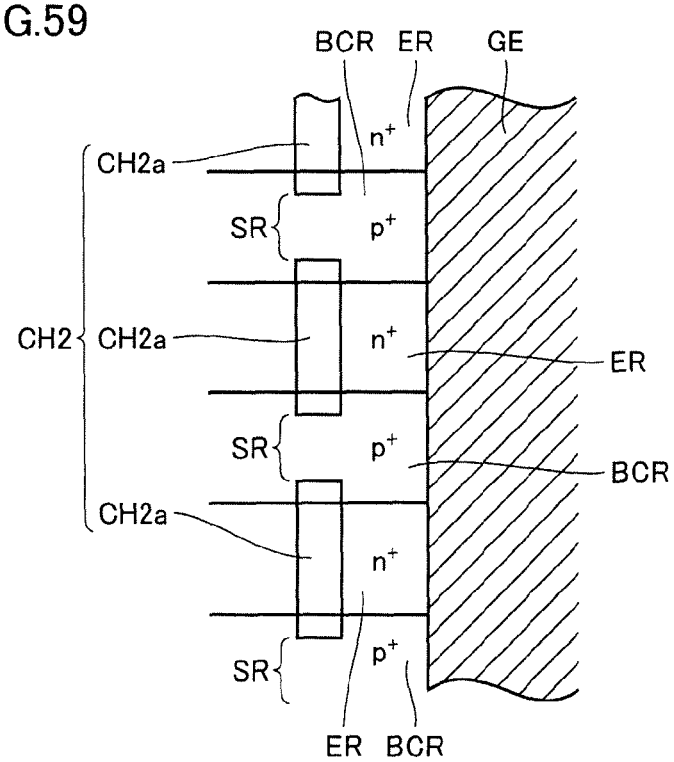
FIG. 59 is a plan view schematically representing a second example of the configuration in which a line contact on an emitter side is divided.

Further, as shown in FIG. 59, only the p-type regions ($p^+$ base contact regions BCR) may be located in the region directly below separation portion SR located between line contact portions CH2a which are adjacent to each other in the planar view. In this case, unevenness in the current due to positional and dimensional deviation of contact recesses CH2 can be suppressed.

Figure 60:
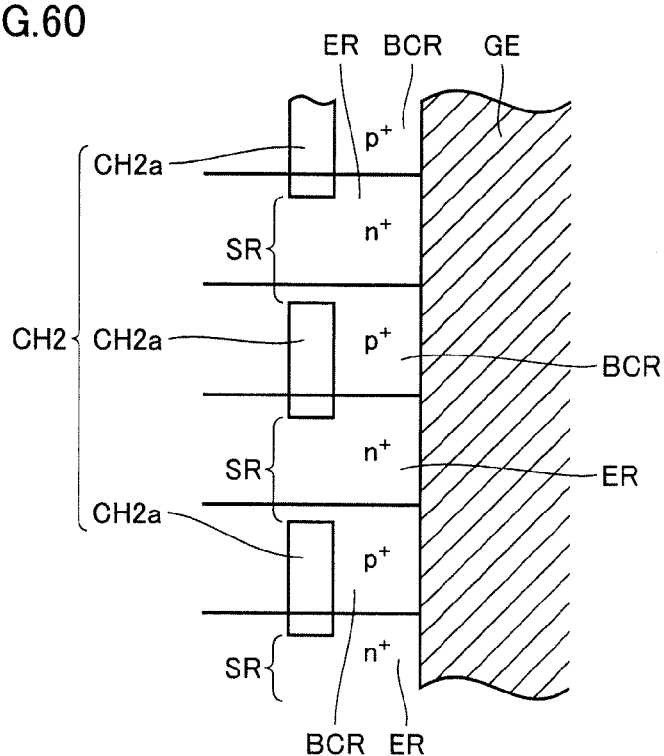
FIG. 60 is a plan view schematically representing a third example of the configuration in which a line contact on an emitter side is divided.
Figure 61:
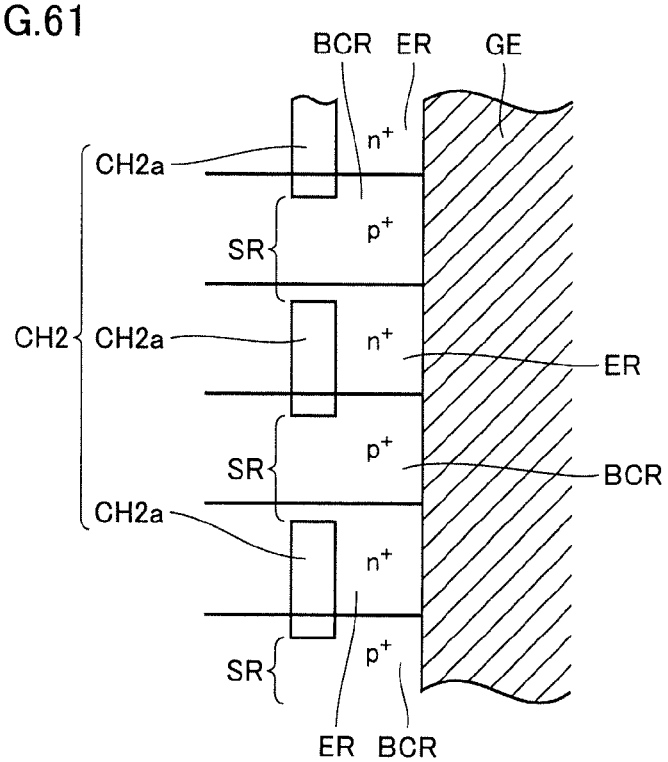
FIG. 61 is a plan view schematically representing a fourth example of the configuration in which a line contact on an emitter side is divided.
Figure 62:
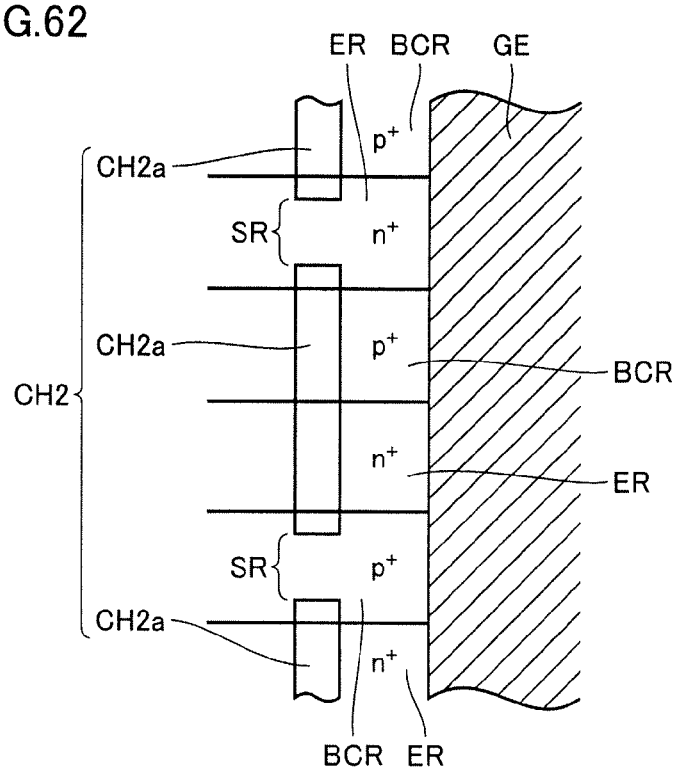
FIG. 62 is a plan view schematically representing a fifth example of the configuration in which a line contact on an emitter side is divided.

Further, as shown in FIGS. 60 to 62, both n-type regions ($n^+$ emitter regions ER) and p-type regions ($p^+$ base contact regions BCR) may be located directly below separation portions SR located between line contact portions CH2a which are adjacent to each other in the planar view.

As shown in FIG. 60, the area of the portion of n-type regions ($n^+$ emitter region ER) located directly below separation portions SR may be larger than the area of the portion of the p-type regions ($p^+$ base contact regions BCR) located directly below separation portions SR. In this case, similarly to the configuration of FIG. 58, unevenness in the on-state breakdown voltage due to positional and dimensional deviation of contact recesses CH2 can be suppressed.

Further, as shown in FIG. 61, the area of the portion of the p-type regions ($p^+$ base contact regions BCR) located directly below separation portions SR may be larger than the area of the portion of the n-type regions ($n^+$ emitter regions ER) located directly below separation portions SR. In this case, similarly to the configuration of FIG. 59, unevenness in the current due to positional and dimensional deviation of contact recesses CH2 can be suppressed.

Further, as shown in FIG. 62, the area of the portion of n-type regions ($n^+$ emitter regions ER) located directly below separation portions SR may be equal to the area of the portion of the p-type regions ($p^+$ base contact regions BCR) located directly below separation portions SR. In this case, similarly to the configuration of FIG. 59, unevenness in the on-state breakdown voltage due to positional and dimensional deviation of contact recesses CH2 can be suppressed.

In the embodiment described above, the case where contact recess CH2 on the emitter side has a plurality of line contact portions CH2a is described. However, contact recess CH1 on the collector side may have a plurality of line contact portions separated from one another and arranged in series.

In FIG. 3, the configuration in which gate electrode layer GE and $n^+$ emitter region ER run linearly in parallel with $p^+$ collector region CR is described. However, gate electrode layer GE and $n^+$ emitter region ER may be arranged to surround $p^+$ collector region CR in the planar view. Further, the breakdown voltage-prioritized IGBT and the current-prioritized IGBT may be formed in a silicon monocrystal substrate or may be formed in SOI (Silicon on Insulator) substrate.

In the embodiment described above, the semiconductor device having a circuit of the PDP scan driver as the one having the breakdown voltage-prioritized IGBT and the current-prioritized IGBT. However, not limited to the semiconductor device according to the embodiment, it may be applied to the semiconductor device having the IGBT other than this.

In the above, the invention made by the inventors is specifically described based on the embodiments. However, the present invention is not limited to those embodiments, and can be modified in various ways without departing from the gist thereof.

REFERENCE SIGNS LIST

BR p-type region; CH1, CH2 recess; CH2a line contact portion; CR collector region; CRa collector region portion; DF crystal defect; DRI drift region; ER emitter region; ES element separation structure; GE gate electrode layer; GI gate insulating film; II interlayer insulating film; LC logic circuit; LS level shifter; MI metal interconnection; NHR separation region; NR n-type region; OC output circuit; PC protection circuit; PR1, PR2 plug layer; SR separation portion; SUB semiconductor substrate.

The invention claimed is:

1. A semiconductor device, comprising:
a semiconductor substrate having a main surface; and
an insulated gate bipolar transistor formed on said main surface,
said insulated gate bipolar transistor including:
a collector region of a first conductivity type formed on said main surface;
a base region of a first conductivity type formed separately from said collector region on said main surface; and
an emitter region of a second conductivity type formed on said main surface within said base region, said semiconductor device further comprising:
an emitter conductive layer connected to both of said base region and said emitter region of said insulated gate bipolar transistor and constituting an emitter connection portion between both of said base region and said emitter region; and
a collector conductive layer connected to said collector region of said insulated gate bipolar transistor and constituting a collector connection portion with said collector region,
said collector conductive layer being connected to one collector active region included in said collector region by a plurality of contacts, and
a number of said contacts of said collector conductive layer to said one collector active region is larger than a number of contacts of said emitter conductive layer to one base active region included in said base region,
wherein a ratio of an area of said emitter connection portion between said base region and said emitter conductive layer to an area in said main surface of said base region is larger than a ratio of an area of said collector connection portion between said collector region and said collector conductive layer to an area in said main surface of said collector region.

2. The semiconductor device according to claim 1, wherein said emitter connection portion has a line contact structure, and
said line contact structure of said emitter connection portion has a plurality of line contact portions separated from one another and arranged in series, and said base region of a first conductivity type and said emitter region of a second conductivity type are located directly below a separation portion located between said plurality of line contact portions arranged in series, and an area of said base region located directly below said separation portion in said main surface is equal to an area of said emitter region located directly below said separation portion in said main surface.

3. The semiconductor device according to claim 1, wherein said collector connection portion has a hole contact structure, and said emitter connection portion has a line contact structure.

4. The semiconductor device according to claim 1, wherein said collector connection portion has a divided line contact structure having a plurality of line contact portions separated from one another and arranged in series, and said emitter connection portion has a line contact structure.

5. The semiconductor device according to claim 1, wherein
said collector connection portion has a hole contact structure, and
said emitter connection portion has a divided line contact structure having a plurality of line contact portions separated from one another and arranged in series.

6. The semiconductor device according to claim 1, wherein each of said collector connection portion and said emitter connection portion has a hole contact structure, and
a hole pitch in said hole contact structure of said collector connection portion is larger than a hole pitch in said hole contact structure of said emitter connection portion.

7. The semiconductor device according to claim 1, wherein each of said collector connection portion and said emitter connection portion has a hole contact structure, and
a hole diameter in said hole contact structure of said collector connection portion is smaller than a hole diameter in said hole contact structure of said emitter connection portion.

8. The semiconductor device according to claim 1, further comprising:
an element separation structure formed on said main surface, wherein
said collector region includes a plurality of collector active regions separated from one another by said element separation structure.

9. The semiconductor device according to claim 1, further comprising:
an impurity region of a second conductivity type formed on said main surface, wherein
said collector region includes a plurality of collector active regions separated from one another by said impurity region.

10. The semiconductor device according to claim 1, wherein
said emitter connection portion has a line contact structure, and
said line contact structure of said emitter connection portion has a plurality of line contact portions separated from one another and arranged in series, and
only said emitter region of a second conductivity type is located directly below a separation portion located between said plurality of line contact portions arranged in series.

11. The semiconductor device according to claim 1, wherein
said emitter connection portion has a line contact structure, and
said line contact structure of said emitter connection portion has a plurality of line contact portions separated from one another and arranged in series, and
said base region of a first conductivity type and said emitter region of a second conductivity type are located directly below a separation portion located between said plurality of line contact portions arranged in series, and
an area of said emitter region located directly below said separation portion in said main surface is larger than an area of said base region located directly below said separation portion in said main surface.

12. The semiconductor device according to claim 1, wherein
said emitter connection portion has a line contact structure, and
said line contact structure of said emitter connection portion has a plurality of line contact portions separated from one another and arranged in series, and
only said base region of a first conductivity type is located directly below a separation portion located between said plurality of line contact portions arranged in series.

13. The semiconductor device according to claim 1, wherein
said emitter connection portion has a line contact structure, and
said line contact structure of said emitter connection portion has a plurality of line contact portions separated from one another and arranged in series, and
said base region of a first conductivity type and said emitter region of a second conductivity type are located directly below a separation portion located between said plurality of line contact portions arranged in series, and
an area of said base region located directly below said separation portion in said main surface is larger than an area of said emitter region located directly below said separation portion in said main surface.

14. A semiconductor device, comprising:
a semiconductor substrate having a main surface; and
an insulated gate bipolar transistor formed on said main surface,
said insulated gate bipolar transistor including:
a collector region of a first conductivity type formed on said main surface;
a base region of a first conductivity type formed separately from said collector region on said main surface; and
an emitter region of a second conductivity type formed on said main surface within said base region, said semiconductor device further comprising:
an emitter conductive layer connected to both of said base region and said emitter region of said insulated gate bipolar transistor; and
a collector conductive layer connected to said collector region of said insulated gate bipolar transistor,
a ratio of an area of a collector connection portion between said collector region and said collector conductive layer to an area in said main surface of said collector region is larger than a ratio of an area of an emitter connection portion between said base region and said emitter conductive layer to an area in said main surface of said base region.

15. The semiconductor device according to claim 14, wherein
said emitter connection portion has a line contact structure, and
said line contact structure of said emitter connection portion has a plurality of line contact portions separated from one another and arranged in series, and said base region of a first conductivity type and said emitter region of a second conductivity type are located directly below a separation portion located between said plurality of line contact portions arranged in series, an area of said base region located directly below said separation portion in said main surface is equal to an area of said emitter region located directly below said separation portion in said main surface.

16. The semiconductor device according to claim 14, wherein each of said collector connection portion and said emitter connection portion has a line contact structure, and a line width of said collector connection portion in said line contact structure is larger than a line width of said emitter connection portion in said line contact structure.

17. The semiconductor device according to claim 14, wherein said collector connection portion has a line contact structure, and said emitter connection portion has a hole contact structure.

18. The semiconductor device according to claim 14, wherein said collector connection portion has a line contact structure, and said emitter connection portion has a divided line contact structure having a plurality of line contact portions separated from one another and arranged in series.

19. The semiconductor device according to claim 14, wherein said collector connection portion has a divided line contact structure having a plurality of line contact portions separated from one another and arranged in series, and said emitter connection portion has a hole contact structure.

20. The semiconductor device according to claim 14, wherein each of said collector connection portion and said emitter connection portion has a hole contact structure, and a hole pitch of said collector connection portion in said hole contact structure is smaller than a hole pitch of said emitter connection portion in said hole contact structure.

21. The semiconductor device according to claim 14, wherein each of said collector connection portion and said emitter connection portion has a hole contact structure, and a hole diameter of said collector connection portion in said hole contact structure is larger than a hole diameter of said emitter connection portion in said hole contact structure.

22. The semiconductor device according to claim 14, further comprising an element separation structure formed on said main surface, wherein said collector region includes a plurality of collector active regions separated from one another by said element separation structure.

23. The semiconductor device according to claim 14, further comprising an impurity region of a second conductivity type formed on said main surface, wherein said collector region includes a plurality of collector active regions separated from one another by said impurity region.

24. The semiconductor device according to claim 14, wherein said emitter connection portion has a line contact structure, and said line contact structure of said emitter connection portion has a plurality of line contact portions separated from one another and arranged in series, and only said emitter region of a second conductivity type is located directly below a separation portion located between said plurality of line contact portions arranged in series.

25. The semiconductor device according to claim 14, wherein said emitter connection portion has a line contact structure, and said line contact structure of said emitter connection portion has a plurality of line contact portions separated from one another and arranged in series, and said base region of a first conductivity type and said emitter region of a second conductivity type are located directly below a separation portion located between said plurality of line contact portions arranged in series, and an area of said emitter region located directly below said separation portion in said main surface is larger than an area of said base region located directly below said separation portion in said main surface.

26. The semiconductor device according to claim 14, wherein said emitter connection portion has a line contact structure, and said line contact structure of said emitter connection portion has a plurality of line contact portions separated from one another and arranged in series, and only said base region of a first conductivity type is located directly below a separation portion located between said plurality of line contact portions arranged in series.

27. The semiconductor device according to claim 14, wherein said emitter connection portion has a line contact structure, and said line contact structure of said emitter connection portion has a plurality of line contact portions separated from one another and arranged in series, and said base region of a first conductivity type and said emitter region of a second conductivity type are located directly below a separation portion located between said plurality of line contact portions arranged in series, an area of said base region located directly below said separation portion in said main surface is larger than an area of said emitter region located directly below said separation portion in said main surface.

* * * * *